(12) United States Patent
Maruyama et al.

(10) Patent No.: US 7,358,028 B2
(45) Date of Patent: Apr. 15, 2008

(54) CHEMICALLY AMPLIFIED POSITIVE PHOTO RESIST COMPOSITION AND METHOD FOR FORMING RESIST PATTERN

(75) Inventors: Kenji Maruyama, Kawasaki (JP); Masaki Kurihara, Kawasaki (JP); Ken Miyagi, Kawasaki (JP); Satoshi Niikura, Kawasaki (JP); Satoshi Shimatani, Kawasaki (JP); Masahiro Masujima, Kawasaki (JP); Kazuyuki Nitta, Kawasaki (JP); Toshihiro Yamaguchi, Kawasaki (JP); Kousuke Doi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 18 days.

(21) Appl. No.: 10/522,036

(22) PCT Filed: May 19, 2004

(86) PCT No.: PCT/JP2004/007139

§ 371 (c)(1),
(2), (4) Date: Jan. 19, 2005

(87) PCT Pub. No.: WO2004/104702

PCT Pub. Date: Dec. 2, 2004

(65) Prior Publication Data

US 2005/0244740 A1    Nov. 3, 2005

(30) Foreign Application Priority Data

May 20, 2003   (JP) ............................. 2003-141805
Dec. 24, 2003  (JP) ............................. 2003-426503

(51) Int. Cl.
G03F 7/039 (2006.01)
G03F 7/20 (2006.01)
G03F 7/30 (2006.01)
G03F 7/38 (2006.01)

(52) U.S. Cl. ................... 430/270.1; 430/326; 430/330; 430/905; 430/919; 430/921

(58) Field of Classification Search ...................... None
See application file for complete search history.

(56) References Cited

U.S. PATENT DOCUMENTS 5,942,367 A      8/1999   Watanabe et al.
6,004,724 A *   12/1999  Yamato et al. ........... 430/281.1
6,072,006 A *    6/2000   Bantu et al. ................. 525/262
6,114,462 A      9/2000   Watanabe et al.
6,262,181 B1     7/2001   Bantu et al.
6,465,150 B1    10/2002  Numata et al.
6,593,056 B2 *   7/2003   Takeda et al. ............... 430/170
6,673,512 B1 *   1/2004   Uenishi et al. ........... 430/270.1
6,869,744 B2 *   3/2005   Hatakeyama ............ 430/270.1
2001/0035394 A1* 11/2001 Takeda et al. ................. 216/41
2002/0012869 A1* 1/2002  Adams et al. ........... 430/270.1

FOREIGN PATENT DOCUMENTS

| EP | 1 164 433 A1 | 12/2001 |
|----|---|---|
| EP | 1 182 506 A1 | 2/2002 |
| JP | 58-194834 | 11/1983 |
| JP | 03-185448 | 8/1991 |
| JP | 04-211258 | 8/1992 |
| JP | 06-043651 | 2/1994 |
| JP | 06-148889 | 5/1994 |
| JP | 06-230574 | 8/1994 |
| JP | 06-289614 | 10/1994 |
| JP | 07-134412 | 5/1995 |
| JP | 09-006001 | 1/1997 |
| JP | 09-068795 | 3/1997 |
| JP | 10-204125 | 8/1998 |
| JP | 10-207066 | 8/1998 |
| JP | 10-268508 | 10/1998 |
| JP | 2001-109155 | 4/2001 |
| JP | 2002-062656 | 2/2002 |
| JP | 2002-072477 | 3/2002 |
| JP | 2002-099090 | 3/2002 |
| JP | 2003-050460 | 2/2003 |
| JP | 2003-167357 | 6/2003 |

OTHER PUBLICATIONS

Office Action dated Jan. 10, 2007 in connection with Korean Patent Application No. 10-2006-7021725.

* cited by examiner

*Primary Examiner*—Sin Lee
(74) *Attorney, Agent, or Firm*—Knobbe, Martens, Olson & Bear LLP

(57) ABSTRACT

The present invention provides a chemical amplification type positive photoresist composition which is excellent in storage stability as a resist solution in a bottle. A novolak resin or a hydroxystyrenic resin is reacted with a crosslinking agent to give a slightly alkali-soluble or alkali-insoluble resin having such a property that solubility in an aqueous alkali solution is enhanced in the presence of an acid, which is then dissolved in an organic solvent, together with (B) a compound generating an acid under irradiation with radiation to obtain a chemical amplification type positive photoresist composition wherein the content of an acid component is 10 ppm or less.

10 Claims, No Drawings

US 7,358,028 B2

CHEMICALLY AMPLIFIED POSITIVE PHOTO RESIST COMPOSITION AND METHOD FOR FORMING RESIST PATTERN

TECHNICAL FIELD

The present invention relates to a novel chemical amplification type positive photoresist composition and relates to a method for formation of a resist pattern.

This application claims priority from Japanese Patent Application No. 2003-141805 filed on May 20, 2003, and Japanese Patent Application No. 2003-426503 filed on Dec. 24, 2003, the disclosure of which is incorporated by reference herein.

BACKGROUND ART

In the fields of the production of semiconductor devices, liquid crystal displays, printing plates, bumps and magnetic heads, for example, there have hitherto been used a photoresist compositions for g-rays, h-rays and i-rays, comprising an alkali soluble resin and a quinonediazido group-containing compound (photoactive compound: PAC) as a main component; and chemical amplification type photoresist compositions for radiation such as i-rays, KrF, ArF and electron beam, comprising an acid dissociable group-containing compound (resin) and a photo acid generator (PAG) as a main component.

Examples of the chemical amplification type photoresist composition include those described in the following Patent Documents 1 to 3.

Patent Document 1 describes a composition comprising a linear polymer having an acid component and a hydroxyl group, PAG and a compound having at least two specific enol ether groups, the linear polymer and the specific compound being crosslinked by heating.

Patent Document 2 describes a composition comprising a linear polymer having an acid group, PAG and a compound having at least two specific enol ether groups, the linear polymer and the specific compound being crosslinked by heating.

Patent Document 3 describes a composition comprising a partially crosslinked polymer, which is obtained by reacting a hydroxyl group-containing polymer with polyvinyl ether in the presence of an acid catalyst, and PAG.

(Patent Document 1) Japanese Patent Application, First Publication No. Hei 6-148889
(Patent Document 2) Japanese Patent Application, First Publication No. Hei 6-230574
(Patent Document 3) Published Japanese Translation No. 2002-529552 of the PCT Application.

Recently, the integration degree of semiconductor devices has increased more and more.

Various proposals have hitherto been made on chemical amplification type resists which contribute to improvement in integration degree of semiconductor devices.

In the following Patent Document 4, there is described a two-component resist comprising a base material resin wherein hydrogen of hydroxyl groups of polyhydroxystyrene having high transparency to a KrF excimer laser beam is substituted with an acid dissociable alkali dissolution inhibiting group, for example, tertiary alkyloxycarbonyl group such as t-boc (tert-butoxycarbonyl) group or acetal group such as 1-ethoxyethyl group, and a photo acid generator as a main component.

A summary of the principle of the resist pattern formation in the resist proposed in Patent Document 4 is as follows.

That is, since the base material resin has an alkali dissolution inhibiting group such as t-boc group, alkali solubility is inferior to polyhydroxystyrene having no t-boc group. When such a resin is mixed with a photo acid generator and the mixture is selectively exposed, the t-boc group is dissociated by an action of an acid generated from a photo acid generator at the exposed area to produce polyhydroxystyrene, and thus the resin becomes alkali soluble.

(Patent Document 4) Japanese Patent Application, First Publication No. Hei 4-211258
(Patent Document 5) Japanese Patent Application, First Publication No. Hei 10-268508
(Patent Document 6) Japanese Patent Application, First Publication No. 2003-167357

DISCLOSURE OF THE INVENTION

However, the compositions described in Patent Documents 1 and 2 have a problem in that they are inferior in storage stability as a resist solution in a bottle.

Also, the composition described in Patent Document 3 has the following problems. That is, acid catalyst used to prepare a polymer remains in the resist and the composition is inferior in storage stability as a resist solution in a bottle after preparing a resist.

In a first aspect, an object of the present invention is to achieve the object (first object).

Poor storage stability as a resist solution in a bottle refers to poor storage stability after preparing a resist solution, and mainly refers to deterioration of properties such as sensitivity.

According to the technique described in Patent Document 4, regarding alkali solubility of a base material resin upon selective exposure, original alkali solubility of polyhydroxystyrene is recovered by dissociation of a t-boc group due to exposure, and more superior alkali solubility can not be achieved. Therefore, it is insufficient in resolution. The use of an alkali dissolution inhibiting group is likely to cause defects in the case of alkali development.

In Patent Document 5, there is proposed a resist material made of a resin prepared by preliminarily crosslinking a resin comprising a hydroxystyrene unit and a cyclohexanol unit with an ether group. However, the resist material is insufficient because a problem such as defects arises.

Defects refers to scum and general defects of a resist pattern, which are detected when observed from right above the developed resist pattern, using a surface defect detection equipment (trade name: "KLA") manufactured by KLA-TENCOR CORPORATION.

In Patent Document 6, there is proposed a photoresist composition comprising a resin wherein some of the hydrogen atoms of hydroxyl groups of hydroxystyrene are protected with an alkali dissolution inhibiting group such as an acetal group, a photo acid generator and a crosslinking polyvinyl ether compound, and the resin and the polyvinyl ether compound are crosslinked by prebaking and patterning is conducted by subjecting to exposure, PEB (post exposure bake) and development. Since the alkali dissolution inhibiting group is introduced into the resin, the resist composition is insufficient because a problem such as defects arise.

Thus, the second object of the present invention is to provide a positive resist composition and resist pattern forming method, which can improve resolution and reduce defects.

The present inventors have intensively researched and found the following means for achieving the above first object.

The chemical amplification type positive photoresist composition of the first aspect (first example) is a chemical amplification type positive photoresist composition (hereinafter referred to as a resist composition, sometimes) prepared by dissolving:

(A) a slightly alkali-soluble or alkali-insoluble novolak resin having a property that solubility in an aqueous alkali solution is enhanced in the presence of an acid, comprising either or both of a constituent unit (a1) represented by the following general formula (I):

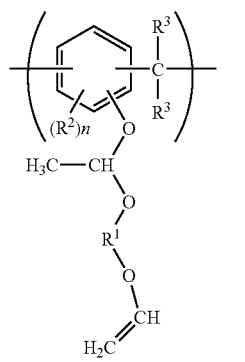

(I)

wherein $R^1$ represents either an alkylene group having 1 to 10 carbon atoms which may have a substituent or a group represented by the following general formula (II):

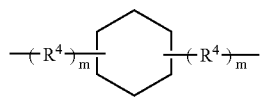

(II)

(wherein $R^4$ represents an alkylene group having 1 to 10 carbon atoms which may have a substituent and m represents 0 or 1), the alkylene group may have an oxygen bond (ether bond) in the main chain, $R^2$ and $R^3$ each independently represents a hydrogen atom or an alkyl group having 1 to 3 carbon atoms, and n represents an integer of 1 to 3, and an intermolecular crosslinked moiety (a2) represented by the following general formula (III):

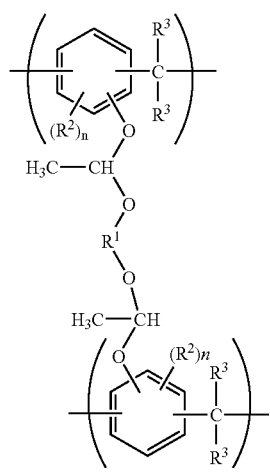

(III)

wherein $R^1$ represents either an alkylene group having 1 to 10 carbon atoms which may have a substituent or a group represented by the above general formula (II) (wherein $R^4$ represents an alkylene group having 1 to 10 carbon atoms which may have a substituent and m represents 0 or 1), the alkylene group may have an oxygen bond (ether bond) in the main chain, $R^2$ and $R^3$ each independently represents hydrogen atom or alkyl group having 1 to 3 carbon atoms, and n represents an integer of 1 to 3; and (B) a compound generating an acid under irradiation with radiation, in an organic solvent (hereinafter sometimes referred to as an acid generator or a photo acid generator), wherein the content of an acid component is 10 ppm or less.

Another chemical amplification type positive photoresist composition of the first aspect (second example) is a chemical amplification type positive photoresist composition prepared by dissolving:

(A') an alkali-slightly soluble or alkali-insoluble polyhydroxystyrenic resin having a property that solubility in an aqueous alkali solution is enhanced in the presence of an acid, comprising either or both of a constituent unit (a'1) represented by the following general formula (IV):

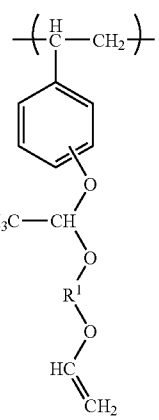

(IV)

wherein $R^1$ represents either an alkylene group having 1 to 10 carbon atoms which may have a substituent or a group represented by the above general formula (II) (wherein $R^4$ represents an alkylene group having 1 to 10 carbon atoms which may have a substituent and m represents 0 or 1), the alkylene group may have an oxygen bond (ether bond) in the main chain, and an intermolecular crosslinked moiety (a'2) represented by the following general formula (V):

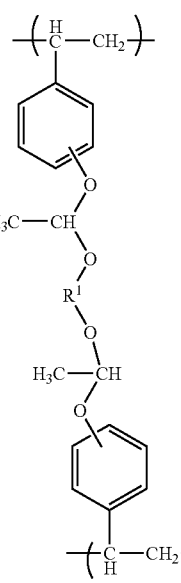

(V)

wherein R¹ represents either an alkylene group having 1 to 10 carbon atoms which may have a substituent or a group represented by the above general formula (II) (wherein R⁴ represents an alkylene group having 1 to 10 carbon atoms which may have a substituent and m represents 0 or 1), the alkylene group may have an oxygen bond (ether bond) in the main chain; and (B) a compound generating an acid under irradiation with radiation, in an organic solvent, wherein the content of an acid component is 10 ppm or less.

Still another chemical amplification type positive photoresist composition of the first aspect (third example) is a chemical amplification type positive photoresist composition prepared by dissolving:

(A″) a slightly alkali-soluble or alkali-insoluble polyhydroxystyrenic resin having a property that solubility in an aqueous alkali solution is enhanced in the presence of an acid, comprising either or both of a constituent unit (a'1) represented by the above general formula (IV), and an intermolecular crosslinked moiety (a'2) represented by the above general formula (V), and a styrenic constituent unit; and (B) a compound generating an acid under irradiation with radiation, in an organic solvent.

The method for synthesis of the above component (A) comprises reacting a novolak resin with a crosslinking agent represented by the following general formula (VI):

$$H_2C=CH-O-R^1-O-CH=CH_2 \quad (VI)$$

wherein R¹ represents either an alkylene group having 1 to 10 carbon atoms which may have a substituent or a group represented by the above general formula (II) (wherein R⁴ represents an alkylene group having 1 to 10 carbon atoms which may have a substituent and m represents 0 or 1, and the alkylene group may have an oxygen bond (ether bond) in the main chain, in the substantial absence of an acid catalyst.

The method for synthesis of the above component (A') comprises reacting a hydroxystyrenic resin with the crosslinking agent represented by the above general formula (VI) in the presence of an acid catalyst.

A method for synthesis of the above component (A″) comprises reacting a hydroxystyrenic resin with the crosslinking agent represented by the above general formula (VI) in the presence of an acid catalyst.

The method for formation of a resist pattern of the first aspect is a method for formation of a resist pattern of a thick-film photolithography process, which comprises forming a resist film having a thickness of 2 to 7 μm made of the chemical amplification type positive resist composition of the first aspect (first to third example) on a substrate, and subjecting to selective exposure, PEB (post exposure bake) treatment and development.

The constituent unit means a unit derived from the respective monomers as raw materials of a polymer in the polymer.

To achieve the second object, the following composition was employed in the second aspect of the present invention.

The chemical amplification type positive photoresist composition of the second aspect is a chemical amplification type positive photoresist composition (hereinafter sometimes referred to as a "two-component chemical amplification type positive photoresist composition") comprising (A2) a resin made of a reaction product of (A1) an alkali soluble resin and (C1) a crosslinking polyvinyl ether compound wherein alkali solubility is enhanced by an action of an acid, and (B1) a photo acid generator generating acid under irradiation with radiation, wherein the component (A1) comprises a unit (a1') derived from (α-methyl)hydroxystyrene represented by the following general formula (I'):

wherein R represents a hydrogen atom or a methyl group and l represents an integer of 1 to 3, and an alkali-insoluble unit (a2') having no acid dissociable dissolution inhibiting group, and wherein a dissolution rate to an aqueous 2.38 wt % solution of the component (A1) in TMAH (tetramethylammonium hydroxide) is from 10 to 100 nm/second.

The resist pattern forming method of the second aspect comprises applying the chemical amplification type positive photoresist composition of the present invention on a substrate, and subjecting to prebaking, selective exposure, PEB (post exposure bake) and alkali development to form a resist pattern.

In the first aspect of the present invention, a chemical amplification type positive photoresist composition which is excellent in storage stability as a resist solution in a bottle is obtained.

In the second aspect of the present invention, an improvement in resolution and reduction of defects can be realized.

BEST MODE FOR CARRYING OUT THE INVENTION

Preferred aspects of the present invention will now be described. The present invention is not limited to the following aspects and constituent elements of these aspects may be appropriately combined.

First Aspect

Chemical Amplification Type Positive Photoresist Composition

Component (A)

The component (A) is a slightly alkali-soluble or alkali-insoluble novolak resin which comprises either or both of a constituent unit (a1) represented by the general formula (I) and an intermolecular crosslinked moiety (a2) represented by the general formula (II), and also has a property that solubility in an aqueous alkali solution is enhanced in the presence of an acid.

The component (A) is preferably obtained by reacting a novolak resin with a crosslinking agent represented by the general formula (VI) in the substantial absence of an acid catalyst. The contents of constituent unit (a1) to the intermolecular crosslinked moiety (a2) in the component (A) vary depending on the reaction conditions and are not specifically limited, and both are commonly included.

When the crosslinking agent is preliminarily linked with hydroxyl groups of the novolak resin, changes in a resist coating solution (composition) over time are suppressed and thus a resist material with less change in sensitivity is obtained. When the resist material is applied on a substrate and is then heated, phenolic hydroxyl groups in the side chain of the component (A) react with a terminal vinyl group of the constituent unit (a1) to form a crosslinked structure. Consequently, the resist coating film becomes slightly soluble in an alkali developer solution such as aqueous alkaline solution used in resist pattern formation. When an acid generated from the component (B) due to exposure reacts with the component (A) having a crosslinked structure, the crosslinked structure is cleaved and solubility of the component (A) in an aqueous alkali solution is enhanced.

Novolak Resin

The novolak resin to be used is not specifically limited as long as it is commonly used in the resist composition and examples thereof include those obtained by condensing at least one aromatic hydroxy compound such as phenol, cresol, xylenol, trimethylphenol, catechol, resorcinol or hydroquinone with aldehydes and/or ketones in the presence of an acidic catalyst.

Aldehydes and ketones are not specifically limited. Examples of preferable aldehydes include formaldehyde, paraformaldehyde, propionealdehyde, salicylaldehyde and crotonaldehyde, and examples of preferable ketones include acetone, methyl ethyl ketone and diethyl ketone.

Examples of the acid catalyst include oxalic acid, p-toluenesulfonic acid and acetic acid. It is preferred to use oxalic acid because it is inexpensive and readily available.

As the aromatic hydroxy compound, at least one of phenol, xylenol (including any isomer) and cresol (including o-, m- and p-isomers) may be used. It is preferred to use m-cresol alone or a mixture of m-cresol/p-cresol in a molar ratio of 30/70 to 50/50 because the resulting resist composition is excellent in general properties such as sensitivity, resolution, and pattern shape.

Aldehydes are preferably those synthesized from formalin and bulky aldehyde in view of an improvement in heat resistance and an increase in sensitivity. Examples of the bulky aldehyde include salicylaldehyde, propionealdehyde and crotonaldehyde. The ratio of formalin to bulky aldehyde is preferably from 1/0.1 to 1/0.6 (molar ratio), and particularly preferably from 1/0.2 to 1/0.5 (molar ratio), in view of superior effects in improving heat resistance.

Therefore, combinations of preferable aromatic hydroxy compounds and preferable aldehydes are particularly preferable.

The weight-average molecular weight as measured by gel permeation chromatography (GPC) using polystyrene standards (Mw, hereinafter merely referred to as a weight-average molecular weight) of the novolak resin is preferably from 1000 to 10000, and particularly preferably from 2000 to 8000, in view of heat resistance, rectangularity of pattern, dependence of resist profile on pattern, resolving power, and increase in sensitivity.

Reaction with Crosslinking Agent

Pretreatment of Novolak Resin

In the case of reacting a novolak resin with a crosslinking agent, the presence of an acid component in the reaction system is not preferable in view of storage stability as a resist solution in a bottle after resist preparation. Therefore, it is preferred to reliably conduct the operation of removing the acid component contained in the novolak resin before reacting with the crosslinking agent. The acid component is an acid catalyst used to synthesize the novolak resin, or an acid component such as free acid which exists in a reaction solvent used during synthesis, and can be analyzed by gas chromatography.

Examples of methods of removing the acid component include conventionally known methods, for example, use of an ion exchange resin, washing with pure water, and neutralization with alkali.

In particular, the method using the ion exchange resin is preferable because the organic acid can be reliably reduced. The method can be conducted by dissolving 100 g of a novolak resin in a mixed solvent of 300 to 600 g of methanol and 30 to 60 g of pure water and purifying the novolak resin solution using an ion exchange resin.

Examples of the ion exchange resin include highly purified monobed resin for use in ultrapure water and, for example, AMBERLITE EG-4 and AMBERLITE EG-290 manufactured by Rohm and Haas Company can be preferably used.

Examples of the purification method include (1) column method and (2) batch method. The column method (1) can be conducted by passing the novolak resin solution through a column filled with an ion exchange resin hydrated sufficiently with pure water one to several times. The batch method (2) can be conducted by weighing an ion exchange resin hydrated sufficiently with pure water (in an amount of about 10% by weight based on the solid content of the novolak resin), charging the ion exchange resin in a beaker containing the novolak resin solution, stirring for about one hour and filtering with a filter paper. Hydration is preferably conducted under the conditions in accordance with the method of use of the exchange resin.

The concentration of the acid component in the novolak resin is preferably adjusted to 0.1 ppm or less, and particularly preferably 0.01 ppm or less, before the reaction with the crosslinking agent.

Crosslinking Agent

In the crosslinking agent represented by the general formula (VI), $R^1$ is a branched, linear, or cyclic alkylene group having 1 to 10 carbon atoms which may have a substituent, or a substituent represented by the general formula (II). The alkylene group may have an oxygen bond (ether bond) in the main chain.

In the general formula (II), $R^4$ is a branched, linear or cyclic alkylene group having 1 to 10 carbon atoms which may have a substituent, and the alkylene group may have an oxygen bond (ether bond) in the main chain. $R^1$ is preferably —$C_4H_8$—, —$C_2H_4OC_2H_4$—, —$C_2H_4OC_2H_4OC_2H_4$—, or a substituent represented by the general formula (II), more preferably a substituent represented by the general formula (II). It is particularly preferable that $R^4$ have one carbon atom and that m be 1.

The content of the crosslinking agent is from 3 to 15% by weight, and preferably from 4 to 8% by weight, based on the solid content of the novolak resin. When the content is less than 3% by weight, reduction in film thickness of the unexposed area of the resist pattern becomes severe and contrast of the resist pattern tends to deteriorate. On the other hand, when the content exceeds 15% by weight, solubility in a developer solution (aqueous alkali solution) tends to drastically decrease, thus causing a problem that sensitivity is poor and resolution of a pattern is not achieved. Since the reaction between the novolak resin and the crosslinking agent proceeds without using an acid catalyst, the use of the acid catalyst is not essential and it is preferable to use no acid catalyst in view of storage stability as a resist solution in a bottle of the resist composition.

After reacting with the crosslinking agent, the weight-average molecular weight of the component (A) is preferably from 10000 to 70000, and particularly preferably from 20000 to 50000, in view of heat resistance, rectangularity of pattern, dependence of resist shape on pattern, resolving power, and increase in sensitivity.

As described above, by removing the acid component from the novolak resin before the reaction or using no acid catalyst upon reaction, it becomes possible to preferably adjust the concentration of an acid in the component (A) after reacting with the crosslinking agent to 10 ppm or less, more preferably 1 ppm or less, and most preferably 0.1 ppm or less.

In the reaction between the novolak resin and the crosslinking agent, for example, after removing the acid component from the novolak resin, the novolak resin is dissolved in the reaction solvent and the solution is concentrated, thereby removing methanol and water remaining in the novolak resin and adjusting the solid content. The solid content is preferably adjusted to about 30% by weight. After the inner temperature is preferably controlled within a range from about 100 to 110° C. by heating, stirring is conducted under the same temperature conditions and a crosslinking agent solution whose solid content is adjusted to about 10 to 50% by weight using the reaction solvent is added dropwise in several portions.

After the completion of dropwise addition, stirring is continuously conducted while maintaining the temperature for about 24 hours, the interior temperature is reduced to room temperature (about 25° C.) and stirring is further conducted under the same temperature conditions for about 12 hours to obtain a component (A). Then, the solvent is replaced by an organic solvent used in the preparation of a resist composition to obtain a mixture of the component (A) and the organic solvent.

Since the acid does not exert a severe influence on the reaction between the novolak resin and the crosslinking agent, it is not necessary to securely control the concentration of the acid in the reaction.

As the reaction solvent, solvents such as methyl isobutyl ketone and γ-butyrolactone can be appropriately used.

As the crosslinking agent, there can also be used the same crosslinking agent as in the second aspect described hereinafter.

Component (A')

The component (A') is a slightly alkali-soluble or alkali-insoluble polyhydroxystyrenic resin having a property that solubility in an aqueous alkali solution is enhanced in the presence of an acid, comprising either or both of a constituent unit (a'1) and the intermolecular crosslinked moiety (a'2).

The component (A') can be synthesized by using a hydroxystyrenic resin in place of the novolak resin in the component (A) and reacting the hydroxystyrenic resin with the crosslinking agent.

The mechanism in which solubility in the aqueous alkali solution varies is the same as in the case of the component (A).

The hydroxystyrenic resin is not specifically limited as long as it is commonly used in the resist composition and comprises a hydroxystyrene constituent unit. Examples thereof include homopolymer of hydroxystyrene, copolymer of hydroxystyrene and the other hydroxystyrenic monomer or styrenic monomer, and copolymer of hydroxystyrene and acrylic acid or methacrylic acid or its derivative.

The content of the hydroxystyrene constituent unit in the hydroxystyrenic resin is at least 50 mol % or more, and preferably 70 mol % or more, in view of reactivity of the crosslinking agent.

In particular, a copolymer comprising a hydroxystyrene constituent unit and at least a styrene constituent unit is preferable because the resulting resist composition has high heat resistance and high sensitivity and the effect of improving shape of a linear resist pattern is exerted. As described above, when the resin component comprising essentially a styrene constituent unit is reacted with the crosslinking agent, the component (A") is obtained. Among these, a copolymer comprising a hydroxystyrene constituent unit and a styrene constituent unit is preferable.

The styrene constituent unit refers to a constituent unit represented by the formula (II') of the second aspect described hereinafter.

The content of the styrene constituent unit is preferably from 1 to 30 mol %, and more preferably from 5 to 15 mol %, in view of reliability of reactivity with the crosslinking agent and improvements in heat resistance and sensitivity.

The weight-average molecular weight of the hydroxystyrenic resin is preferably from 1000 to 8000, and particularly preferably from 2000 to 5000, in view of heat resistance, rectangularity of pattern, dependence of resist shape on pattern, resolving power, increase in sensitivity, and stability of the reaction with the crosslinking agent.

Reaction with Crosslinking Agent

Pretreatment of Hydroxystyrenic Resin

The hydroxystyrenic resin and the crosslinking agent are commonly reacted in the presence of an acid catalyst. As the acid catalyst, there can be used those exemplified in the description of the synthesis of the novolak resin.

In the case of reacting the hydroxystyrenic resin with the crosslinking agent, the content of the entire acid component containing the acid catalyst is preferably adjusted within a range from 10 to 1000 ppm, and preferably from 50 to 500 ppm, based on the solid content of the resin. Since the hydroxystyrenic resin itself contains very low levels of acid impurities, the concentration of the acid in the reaction system during reaction is almost the same as that of the acid catalyst to be added as the catalyst, and thus the concentration of the acid upon reaction can be controlled by the amount of the acid catalyst.

When the content exceeds 1000 ppm, it is not preferable in view of storage stability as a resist solution in a bottle after resist preparation. On the other hand, when the content is less than 10 ppm, the reaction may not proceed because insufficient catalytic effect is exerted upon crosslinking.

After the reaction, the operation of removing the acid component contained in the reaction product is preferably conducted, if necessary. The acid component can be removed by the same method as in the case of the novolak resin.

As a result, the concentration of the acid in the styrenic resin after the reaction can be adjusted to preferably 10 ppm or less, and more preferably 1 ppm or less, in the component (A').

After the crosslinking reaction sufficiently proceeded, a basic compound such as pyridine can be used for the purpose of controlling or terminating the crosslinking reaction.

In view of stability over time of the resin after the reaction, basic compound is preferably used in the amount of about 1 to 5% by weight based on the solid content of the resin.

After reacting with the crosslinking agent in such a manner, the weight-average molecular weight of the component (A') is preferably from 50000 to 150000, and particularly preferably from 60000 to 100000, in view of heat resistance, rectangularity of pattern, dependence of resist shape on pattern, resolving power, increase in sensitivity, suppression of reduction in film thickness of the unexposed area, and an improvement in coatability.

Crosslinking Agent

As the crosslinking agent, there can be used those exemplified in the description of the component (A).

The content of the crosslinking agent is from 3 to 15% by weight, and preferably from 5 to 10% by weight, based on the solid content of the hydroxystyrenic resin. When the content is less than 3% by weight, reduction in film thickness of the unexposed area of the resist pattern becomes severe and contrast of the resist pattern tends to deteriorate. On the other hand, when the content exceeds 15% by weight, solubility in a developer solution (aqueous alkali solution) tends to drastically decrease, thus causing a problem that sensitivity is poor and resolution of a pattern is not achieved.

In the reaction between the hydroxystyrenic resin and the crosslinking agent, for example, after synthesizing the hydroxystyrenic resin and optionally removing the acid component, the hydroxystyrenic resin is dissolved in the reaction solvent and the solution is concentrated, thereby removing methanol and water remaining in the hydroxystyrenic resin and adjusting the solid content. The solid content is preferably adjusted to about 30% by weight.

After an acid catalyst is added to the concentrated solution and the inner temperature is preferably controlled within a range from about 100 to 110° C. by heating, stirring is conducted under the same temperature conditions and a crosslinking agent solution whose solid content is adjusted to about 10 to 50% by weight using the reaction solvent is added dropwise in several portions. After the completion of dropwise addition, stirring is continuously conducted while maintaining the temperature for about 20 hours, inner temperature is reduced to room temperature (about 25° C.) and stirring is further conducted under the same temperature conditions for about one hour. Then, an organic solvent such as 2-heptanone used in the preparation of a resist composition is added and dissolved.

The solution is washed several times with a solution, for example, methanol/water to remove the acid component. After separating the organic layer such as 2-heptanone, the residue was concentrated and the remaining methanol/water was removed to obtain a mixture of the component (A') and the organic solvent.

Examples of the reaction solvent include methyl isobutyl ketone and γ-butyrolactone. Since the acid exerts severe influence on the reaction between the hydroxystyrenic resin and the crosslinking agent, it is necessary to securely control the concentration of the acid in the reaction and stable γ-butyrolactone having less acid content is preferably selected.

The resist composition of this aspect may contain either or both of the components (A) and (A') (preferably the component (A")). As the components (A) and (A') (preferably the component (A")), one or more different kinds may be used in combination.

Component (B)

The component (B) is not specifically limited and examples thereof include photo acid generators which are conventionally known as constituent material of a chemical amplification type positive photoresist composition.

For example, there can be used sulfonylazomethane photo acid generators, onium salt photo acid generators and oxime sulfonate photo acid generators.

Among these photo acid generators, those having i-ray absorption are preferable because a conventional i-ray stepper can be employed as it is. In this case, a resist composition suited for i-rays can be obtained.

Examples of the component (B) suited for i-ray exposure including the following compounds.

Compounds represented by the following general formulas (ii) and (iii):

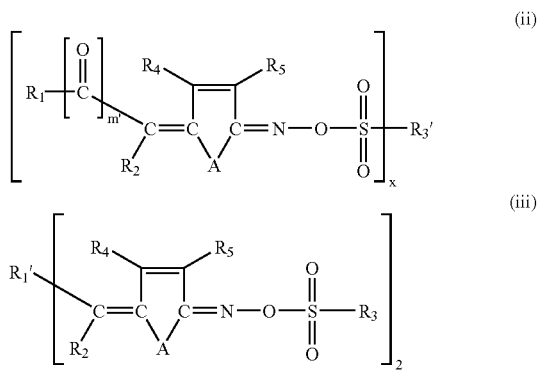

wherein m' represents 0 or 1; X represents 1 or 2; $R_1$ represents a phenyl group which may be substituted with one or more alkyl groups having 1 to 12 carbon atoms, a heteroaryl group, or an alkoxycarbonyl group having 2 to 6 carbon atoms, a phenoxycarbonyl group or CN when m' is 0; $R_1'$ represents an alkylene group having 2 to 12 carbon atoms; $R_2$ represents a phenyl group which may be substituted with one or more alkyl groups having 1 to 12 carbon atoms, a heteroaryl group, or an alkoxycarbonyl group having 2 to 6 carbon atoms, phenoxycarbonyl group or CN when m' is 0; $R_3$ represents an alkyl group having 1 to 18 carbon atoms; $R_3'$ represents an alkyl group having 1 to 18 carbon atoms when X=1, or an alkylene group having 2 to 12 carbon atoms or a phenylene group when X=2; $R_4$ and $R_5$ each independently represents a hydrogen atom, halogen, or an alkyl group having 1 to 6 carbon atoms; A represents S, O or $NR_6$; and $R_6$ represents a hydrogen atom or a phenyl group (U.S. Pat. No. 6,004,724). Specific examples thereof include thiolene-containing oxime sulfonate represented by the following formula (VII):

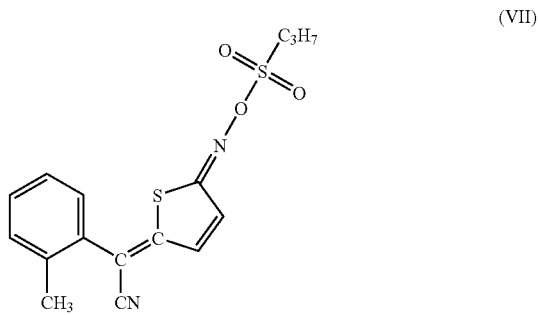

There is also exemplified a bis(trichloromethyl)triazine compound represented by the following formula (iv):

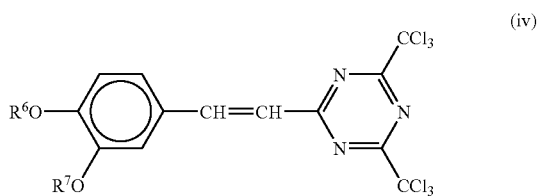

wherein $R^6$ and $R^7$ each represents alkyl group having 1 to 3 carbon atoms, or a combination of the compound (iv) and a bis(trichloromethyl)triazine compound represented by the following formula (v):

(v)

wherein Z represents a 4-alkoxyphenyl group (Japanese Patent Application, First Publication No. Hei 6-289614 and Japanese Patent Application, First Publication No. Hei 7-134412).

Specific examples of the triazine compound (iv) include 2-[2-(3,4-dimethoxyphenyl)ethenyl]-4,6-bis(trichloromethyl)-1,3,5-triazine, 2-[2-(3-methoxy-4-ethoxyphenyl) ethenyl]-4,6-bis(trichloromethyl)-1,3,5-triazine, 2-[2-(3-methoxy-4-propoxyphenyl)ethenyl]-4,6-bis (trichloromethyl)-1,3,5-triazine, 2-[2-(3-ethoxy-4-methoxyphenyl)ethenyl]-4,6-bis(trichloromethyl)-1,3,5-triazine, 2-[2-(3,4-diethoxyphenyl)ethenyl]-4,6-bis (trichloromethyl)-1,3,5-triazine, 2-[2-(3-ethoxy-4-propoxyphenyl)ethenyl]-4,6-bis(trichloromethyl)-1,3,5-triazine, 2-[2-(3-propoxy-4-methoxyphenyl)ethenyl]-4,6-bis(trichloromethyl)-1,3,5-triazine, 2-[2-(3-propoxy-4-ethoxyphenyl)ethenyl]-4,6-bis(trichloromethyl)-1,3,5-triazine and 2-[2-(3,4-dipropoxyphenyl)ethenyl]-4,6-bis (trichloromethyl)-1,3,5-triazine. These triazine compounds may be used alone or in combination.

Examples of the triazine compound (v), which is optionally used in combination with the triazine compound (iv), include 2-(4-methoxyphenyl)-4,6-bis(trichloromethyl)-1,3,5-triazine, 2-(4-ethoxyphenyl)-4,6-bis(trichloromethyl)-1,3,5-triazine, 2-(4-propoxyphenyl)-4,6-bis(trichloromethyl)-1,3,5-triazine, 2-(4-butoxyphenyl)-4,6-bis(trichloromethyl)-1,3,5-triazine, 2-(4-methoxynaphthyl)-4,6-bis (trichloromethyl)-1,3,5-triazine, 2-(4-ethoxynaphthyl)-4,6-bis(trichloromethyl)-1,3,5-triazine, 2-(4-propoxynaphthyl)-4,6-bis(trichloromethyl)-1,3,5-triazine, 2-(4-butoxynaphthyl)-4,6-bis(trichloromethyl)-1,3,5-triazine, 2-(4-methoxy-6-carboxynaphthyl)-4,6-bis(trichloromethyl)-1,3,5-triazine, 2-(4-methoxy-6-hydroxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(5-ethyl-2-furyl)ethenyl]-4,6-bis(trichloromethyl)-1,3,5-triazine, 2-[2-(5-propyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3-methoxy-5-ethoxyphenyl)ethenyl]-4,6-bis (trichloromethyl)-1,3,5-triazine, 2-[2-(3-methoxy-5-propoxyphenyl)ethenyl]-4,6-bis(trichloromethyl)-1,3,5-triazine, 2-[2-(3-ethoxy-5-methoxyphenyl)ethenyl]-4,6-bis (trichloromethyl)-1,3,5-triazine, 2-[2-(3,5-diethoxyphenyl) ethenyl]-4,6-bis(trichloromethyl)-1,3,5-triazine, 2-[2-(3-ethoxy-5-propoxyphenyl)ethenyl]-4,6-bis(trichloromethyl)-1,3,5-triazine, 2-[2-(3-propoxy-5-methoxyphenyl)ethenyl]-4,6-bis(trichloromethyl)-1,3,5-triazine, 2-[2-(3-propoxy-5-ethoxyphenyl)ethenyl]-4,6-bis(trichloromethyl)-1,3,5-triazine, 2-2-(3,5-dipropoxyphenyl)ethenyl]-4,6-bis (trichloromethyl)-1,3,5-triazine, 2-(3,4-methylenedioxyphenyl)-4,6-bis(trichloromethyl)-1,3,5-triazine and 2-[2-(3,4-methylenedioxyphenyl)ethenyl]-4,6-bis (trichloromethyl)-1,3,5-triazine. These triazine compounds may be used alone or in combination.

There is also exemplified a compound represented by the following formula (vi):

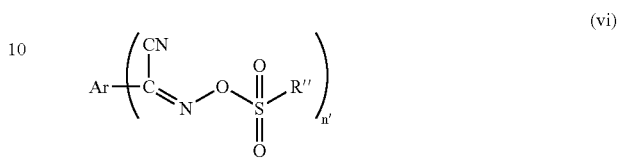

(vi)

wherein Ar represents a substituted or unsubstituted phenyl group or a naphthyl group; R" represents an alkyl group having 1 to 9 carbon atoms; and n' represents an integer of 2 or 3. These compounds may be used alone or in combination. Among these compounds, a compound represented by the formula (VII) and a compound represented by the following formula (vii) are preferably used because they are excellent in acid generation efficiency to i-rays.

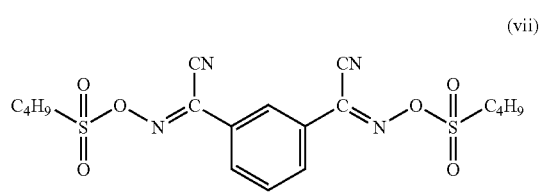

(vii)

As the component (B), one or more kinds can be used.

The amount of the component (B) is preferably from 0.5 to 5 parts by weight, and preferably from 1 to 4 parts by weight, based on 100 parts by weight of the solid content of the resin. When the amount is less than 0.5 parts by weight, sufficient pattern formation may not occur. On the other hand, when the amount exceeds 5 parts by weight, reduction in film thickness of the unexposed area tends to becomes severe and storage stability as a resist solution by particles of the resist composition tends to deteriorate, unfavorably.

Component (C)

The resist composition of this aspect preferably contains a basic compound (preferably an amine) as the component (C) so as to enhance storage stability.

The compound is not specifically limited as long as it has compatibility with the resist composition, and examples thereof include a compound described in Japanese Patent Application, First Publication No. Hei 9-6001. The disclosure of Japanese Patent Application, First Publication No. Hei 9-6001 is incorporated by reference herein.

Among these, a tertiary amine is preferable, and tri-n-octylamine and tri-n-decylamine are particularly preferable in view of storage stability as a resist solution in a bottle. Also pyridine compounds, particularly 2,6-lutidine is preferable because of excellent PED (post exposure delay) after exposure.

As the component (C), one or more kinds can be used in combination.

The content of the component (C) is preferably from 0.01 to 5.0 parts by weight, and particularly preferably from 0.1 to 1.0 parts by weight, based on 100 parts by weight of the solid content of the resin in view of the effect.

Organic Solvent

The organic solvent is not specifically limited as long as it is used in the chemical amplification type positive resist composition.

Examples thereof include ester solvents such as propylene glycol monoalkyl ether acetate (for example, propylene glycol monomethyl ether acetate (PGMEA)) and lactate ester (for example, ethyl lactate); and non-ester solvents, for example, ketones such as acetone, methyl ethyl ketone, cyclohexanone, methyl isoamyl ketone and 2-heptanone, polyhydric alcohols such as ethylene glycol, propylene glycol, diethylene glycol, or their derivatives such as monomethyl ether, monoethyl ether, monopropyl ether, monobutyl ether or monophenyl ether of polyhydric alcohols, and cyclic ethers such as dioxane. The ester solvents are reaction products of the organic carboxylic acid and the alcohol and therefore contain an organic carboxylic acid such as a free acid. Therefore, in the resist composition containing no component (C) or the resist composition containing no storage stabilizer described hereinafter, non-ester solvents containing no free acid are preferably selected and ketones (ketone solvents) are preferable. Among these, 2-heptanone is particularly preferable in view of coatability and solubility of the component (B).

Both ester and non-ester solvents are sometimes decomposed over time to produce an acid as by-product; however, the decomposition reaction is suppressed in the presence of the component (C) or the storage stabilizer described hereinafter. The ester solvents exert a remarkable effect and are preferable in the presence of the component (C) and the storage stabilizer, and PGMEA is particularly preferable.

It has been confirmed that the acid component as a by-product produced from the decomposition is formic acid, acetic acid or propionic acid in the case of 2-heptanone.

One or more organic solvents can be used alone or in combination.

The organic solvent is used so that the solid content of the resist composition falls within a range from 20 to 50% by weight, and preferably from 25 to 45% by weight, in view of coatability.

The resist composition of this aspect preferably contains the following storage stabilizers, if necessary.

In addition to the ester solvents, non-ester solvents are sometimes decomposed to produce an acid component as a by-product.

In such a case, the storage stabilizer is preferably added.

The storage stabilizer is not specifically limited as long as it has an action of suppressing the decomposition reaction of the solvent, and examples thereof include antioxidants described in Japanese Patent Application, First Publication No. Sho 58-194834. The disclosure of Japanese Patent Application, First Publication No. Sho 58-194834 is incorporated by reference herein. As the antioxidant, a phenolic compound and an amine compound are known and the phenolic compound is preferable. Particularly, 2,6-di(tert-butyl)-p-cresol and its derivative are preferable because they are effective against deterioration of the ester solvent and the ketone solvent and are commercially available, and are also inexpensive and excellent in storage stabilization effect. In particular, they are excellent in deterioration preventing effect to propylene glycol monoalkyl ether acetate and 2-heptanone.

The content of the storage stabilizer is preferably from 0.01 to 3 parts by weight, and particularly preferably from 0.1 to 1.0 parts by weight, based on 100 parts by weight of the solid content of the resin.

When the content is less than the above range, sufficient storage stabilization effects cannot be obtained. On the other hand, when the content exceeds the above range, it is not preferable in view of reduction in film thickness of the top portion of the resist pattern shape, deterioration in sensitivity, and change in exposure margin.

Since the resist composition used in a thick-film photolithography process (hereinafter sometimes abbreviated to "for thick-film" or "for thick-film process") described hereinafter commonly has high resist concentration (solid content), it can cause deposition of foreign matter because of unstable solubility in the resist of the component (B). In such a case, solvent stabilizers are preferably added in the composition.

The solid content of the resist composition for thick-film is adjusted within a range from 25 to 50% by weight, and preferably from 30 to 40% by weight, in view of coatability of the thick film.

As the solvent stabilizer, γ-butyrolactone is particularly preferable.

The content of the solvent stabilizer is preferably within a range from 1 to 10 parts by weight, and particularly preferably from 3 to 7 parts by weight, based on 100 parts by weight of the solid content of the resist composition.

When the content is less than the above range, deposition of the component (B) or deterioration over time of foreign matter occurs. On the other hand, when the content exceeds the above range, it is not preferred in view of deterioration of residual film property of unexposed area.

To the resist composition of this aspect, there can be optionally added additives having compatibility, for example, additive resins, plasticizers, stabilizers and surfactants used for improving performances of the resist film; colorants used for further visualizing the developed images; sensitizers and antihalation dyes used for further improving the sensitization effect; and conventional additives such as adhesion improvers; as long as the object of the present invention is not adversely affected.

The concentration of the acid component in the resist composition is preferably 10 ppm or less, more preferably 8 ppm or less, and most preferably 5 ppm or less, in view of storage stability as a resist solution in a bottle. The closer to zero, the more preferable, and thus there is no technical meaning in limitation of the lower limit.

As described above, the concentration of the acid component can be adjusted by performing a treatment of decreasing the concentration of the acid component in the components (A) and (A') to be as low as possible, using an organic solvent which is less likely to generate an acid component, adding tertiary amine, or adding a storage stabilizer.

In the component (A'), the component (A") comprising a hydroxystyrene constituent unit and a styrene constituent unit is preferably used because the resist composition has high heat resistance and high sensitivity and the effect of improving shape of a linear resist pattern is exerted.

In view of these effects, it is not necessarily essential to adjust the content of the acid component to 10 ppm or less in the positive photoresist composition.

When the chemical amplification type positive photoresist composition (third example) using the component (A") comprises a crosslinked structure obtained by reacting with the crosslinking agent and a styrene constituent unit, the resulting resist composition has high heat resistance and high sensitivity and the effect of improving shape of a linear resist pattern is exerted.

Method for Formation of Resist Pattern

The resist composition thus formed is suited for use in a so-called thick-film process wherein a film thickness is from about 2 to 7 μm.

The thick-film resist pattern can be employed as a resist for high energy implantation or a resist for metal wiring.

In particular, heat resistance is required of the resist composition for thick-film. The resist composition of this aspect is excellent in heat resistance and is highly sensitized, and therefore it can sufficiently meet the level required.

Preferable methods for use of the resist composition of this aspect will now be described by way of mainly a thick-film photolithography process (hereinafter referred to as a thick-film process).

First, a resist composition prepared by dissolving various components in an organic solvent is applied on a substrate such as a silicon wafer using a spinner, and this is then prebaked to form a thick resist film (photosensitive layer) having a thickness of about 2 to 7 μm. Then, the resist film is selectively exposed via a desired mask pattern by irradiating with light, preferably i-rays (365 nm) using a light source such as a low-pressure mercury lamp, high-pressure mercury lamp or ultrahigh-pressure mercury lamp. Then, when the resist film was subjected to a PEB (post exposure bake) treatment is conducted under heating conditions at about 90 to 150° C. and it is dipped in a developer solution, for example, an aqueous alkali solution such as aqueous 1-10 wt % solution of tetramethylammonium hydroxide (TMAH), and the exposed area is dissolved and removed to obtain images which are faithful to the mask pattern. Then, postbaking is conducted under heating conditions of about 90 to 140° C. to form a resist pattern for thick-film process.

The resist pattern has excellent rectangular shape even under thick-film conditions of about 2 to 7 μm. Therefore, it is suited for use as a resist film for implantation or metal wiring.

The resist composition of this aspect exerts the following effects.

That is, it is excellent in storage stability as a resist solution in a bottle.

Also, it has advantages such as low cost.

Since a large amount of very expensive materials are used, both a conventional resist composition containing an alkali soluble resin and PAC as a main component and chemical amplification type photoresist composition containing an acid dissociable group-containing resin and a photo acid generator as a main component have a problem in that it is impossible to cope with recent reductions in production cost because of high material cost. In the former, expensive materials are PAC and sensitivity improvers (sensitizers). In the latter, expensive materials are mono-dispersed polyhydroxystyrene synthesized by living anion polymerization and a resin component having a special acid dissociable group.

In the resist composition of this aspect, cost reduction can be made because these materials need not necessarily be used.

According to the resist composition of this aspect, it is made possible to obtain a resist pattern which is excellent in rectangularity of profile and also has good shape.

The resist composition of this aspect is excellent in heat resistance, sensitivity behavior, and rectangularity of the profile and is therefore suited for formation of a thick-film resist pattern for implantation or metal wiring.

Upon metal wiring formation, a heat treatment at high temperature, referred to as postbake after formation of a resist pattern so as to improve heat resistance upon implantation, is commonly conducted. The resist pattern formed by using a conventional resist composition has a problem that taper shape is further enlarged upon postbaking.

Since the rectangular shape of the resist pattern is reliably required in the implantation, it is necessary to realize a material capable of forming a resist pattern having an excellent rectangular shape.

In this aspect, there is exerted the effect of maintaining the rectangular shape of the resist pattern even after postbaking.

The resist composition of this aspect exhibits low dependence on pattern size and, for example, a resist pattern having an excellent rectangular shape can be obtained even when a fine resist pattern having a width of about 1 μm is formed. Also, when a very large resist pattern having a large width of more than 100 μm is formed, the profile is not tapered and has good shape.

As described above, since both fine pattern and rough pattern can be obtained as patterns having good shape, the photoresist composition of this aspect is suited for use in which patterns having different sizes are formed on a substrate at a time, for example, in a system LCD.

Second Aspect

Chemical Amplification Type Positive Photoresist Composition

The chemical amplification type positive resist composition of the second aspect is a two-component chemical amplification type positive photoresist composition comprising (A2) a resin made of a reaction product of (A1) an alkali soluble resin and (C1) a crosslinking polyvinyl ether compound wherein alkali solubility enhances by an action of an acid, and (B1) a photo acid generator generating acid under irradiation with radiation, wherein the component (A1) comprises a unit (a1') derived from (α-methyl)hydroxystyrene represented by the above general formula (I') and an alkali-insoluble unit (a2') having no acid dissociable dissolution inhibiting group, and wherein a dissolution rate to an aqueous 2.38% by weight solution of the component (A1) in TMAH (tetramethylammonium hydroxide) is from 10 to 100 nm/second. (A2) Resin made of reaction product of the components (A1) and (C1) wherein alkali solubility is enhanced by an action of an acid First, the reaction product of the components (A1) and (C1) (hereinafter referred to as a component (A2)) will now be described.

Component (A2)

The component (A2) is a reaction product obtained by reacting the component (A1) with the component (C1) and is slightly soluble or insoluble in an aqueous alkali solution, and also has a property that alkali solubility is enhanced by an action of an acid.

When the component (A1) is reacted with the component (C1), there is obtained a reaction product comprising a constituent unit wherein one terminal vinyl group of the component (C1) is linked to phenolic hydroxyl groups in the side chain of the component (A1).

Specific examples of the constituent unit include a constituent unit represented by the following general formula (2A).

When the component (A1) is reacted with the component (C1), there is obtained a reaction product comprising a moiety wherein both terminal vinyl groups of the component (C1) are linked to two phenolic hydroxyl groups in the side chain of the component (A1). Specific examples of the constituent unit include inter-molecular crosslinking unit represented by the following general formula (2B).

There is commonly obtained a reaction product (a) comprising both constituent unit (for example, (2A)) wherein only one terminal group of the component (C1) is linked and a moiety (for example, (2B)) wherein both terminal groups are linked.

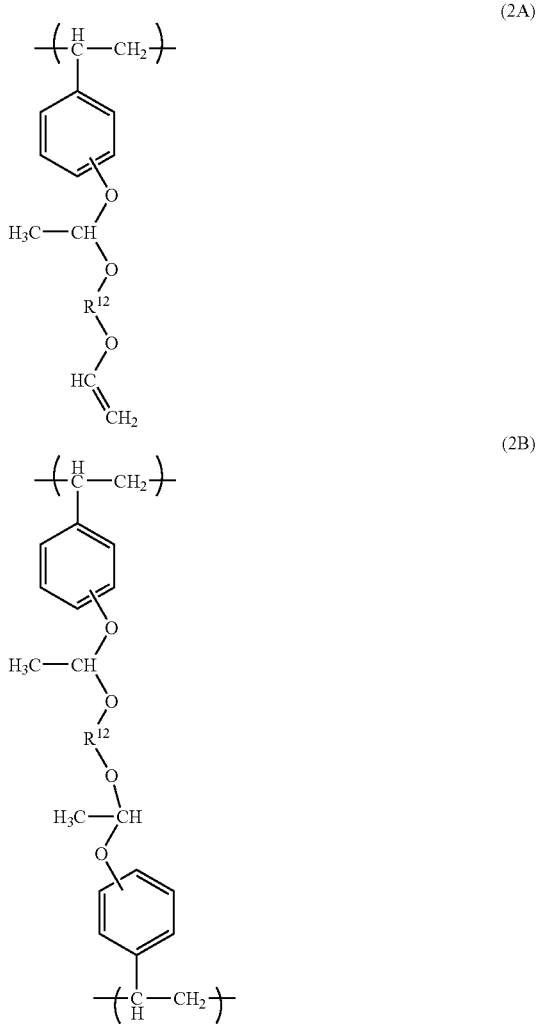

$R^{12}$ is the same as in the general formula (III') described hereinafter.

The component (A2) in this example can be preferably obtained by reacting the component (A1) with the component (C1) in the substantial absence of an acid catalyst. Consequently, a crosslinked structure due to component (C1) is formed in the component (A1) and the base resin (A2) in the resist composition preferably becomes slightly soluble or insoluble in an aqueous alkali solution such as alkali developer used to form a resist pattern.

By preliminarily linking the component (C1) with hydroxyl groups in the side chain of the alkali soluble resin (A1), change over time of the chemical amplification type positive photoresist composition is suppressed and thus a material with less change in sensitivity is obtained.

When the chemical amplification type positive photoresist composition is applied and heated, a resist coating film is formed. At this time, when the unreacted phenolic hydroxyl groups in the side chain of the component (A2) remain, they react with terminal vinyl groups of the constituent unit (A2) to form a crosslinked structure.

When an acid generated from the component (B1) under exposure reacts with the component (A2) having the crosslinked structure, the crosslinked structure is cleaved and solubility of the component (A2) in an aqueous alkali solution is enhanced.

In this embodiment, since the component (A1) is preliminarily reacted with the component (C1), it is not necessary to enable the crosslinking reaction to proceed upon prebaking and the prebaking temperature conditions are less likely to be limited. Specifically, the crosslinking reaction can proceed at a temperature of 120° C. or lower.

In the case of reacting the component (A1) with the component (C1), it is preferred to securely control the concentration of the acid component. In view of stability over time, it is not preferred that the component (A1) contain the acid component as impurities. Therefore, it is preferred to securely conduct the operation of removing the acid component contained in the component (A1) before reacting with the component (C1). The acid component can be analyzed by gas chromatography. Examples of the method of removing the acid component include conventionally known methods, for example, use of an ion exchange resin, washing with pure water, and neutralization with alkali.

The concentration of the acid component in the component (A1) before reacting with the component (C1) is preferably adjusted to 0.1 ppm or less, and particularly preferably 0.01 ppm or less.

The content of the component (C1) is from 5 to 50% by weight, and preferably 10 to 30% by weight, based on the component (A1). When the content is more than the lower limit, it is made possible to prevent such a disadvantage that the crosslinking reaction does not sufficiently proceed and contrast between the unexposed area and the exposed area deteriorates. When the content is less than the upper limit, it is made possible to prevent such a disadvantage that uniformity of the composition in the resist coating film cannot be obtained and lithographic properties deteriorate.

The weight-average molecular weight (Mw: value as measured by gel permeation chromatography using polystyrene standards) of the component (A2) is, for example, from 20000 to 150000, and preferably 30000 to 100000, in view of stability with time and reduction in defects. When the weight-average molecular weight is within the above range, it is made possible to prevent such a disadvantage that the resulting composition becomes insoluble in a solvent and dry etching resistance deteriorates.

The dispersion degree (Mw/Mn: Mn is a number-average molecular weight) of the component (A2) is preferably from 1.0 to 5.0, and more preferably 1.0 to 3.0, in view of improvement in resolution and reduction in defects. The component (A2) is preferably used in a two-component amplification type positive photoresist composition containing a component (B1) described hereinafter.

(A1) Alkali Soluble Resin

Unit (a1') Derived from (α-methyl)hydroxystyrene

When the component (A1) comprises a constituent unit (a1'), the entire component (A1) becomes soluble in alkali and a crosslinking reaction product of the components (A1) and (C1) can be obtained by the reaction with the component (C1) or heating upon prebaking.

In the formula (I'), R is a hydrogen atom or a methyl group and is preferably a hydrogen atom.

In view of availability, 1 is preferably 1.

The hydroxyl group may be substituted on any of the o-, m- and the p-positions. When 1 is 2 or 3, any substitution positions can be combined. When 1 is 1, the hydroxyl group may be substituted on any of the o-, m- and p-positions, and preferably p-position in the view of easily availability and low price.

The term "(α-methyl)hydroxystyrene" means either or both of hydroxystyrene and α-methylhydroxystyrene. The term "constituent unit derived from (α-methyl)hydroxystyrene" means a constituent unit constituted by cleavage of ethylenical double bonds of (α-methyl)hydroxystyrene.

In claims and the specification, the term "unit" or "constituent unit" means a monomer unit constituting a polymer.

The content of the constituent unit (a1') in the component (A1) is preferably 60 mol % or more, more preferably from 70 to 90 mol %, and most preferably from 75 to 85 mol %, in view of control of solubility due to the reaction with the component (C1). Alkali-insoluble unit (a2') having no acid dissociable dissolution inhibiting group In the constituent unit (a2'), the term "having no acid dissociable dissolution inhibiting group" means that a constituent unit wherein hydrogen atom of the hydroxyl group is substituted with an acid dissociable alkali dissolution inhibiting group such as t-boc (tert-butoxycarbonyl) group or ethoxyethyl group in a unit having a phenolic hydroxyl group, and a tertiary ester constituent unit as a (meth)acrylate unit ((meth)acrylate means either or both of acrylate and methacrylate) wherein an OH group of a carboxyl group of a constituent unit derived from (meth)acrylic acid is substituted with a tertiary alkyloxy group are excluded.

When the resist composition of this aspect comprises a constituent unit (a2') which is scarcely influenced by the acid component generated from the component (B1) described hereinafter and is also alkali-insoluble (insoluble in an alkali developer solution), it is made possible to prevent swelling of a resist pattern due to alkali development and to improve resolution of a fine pattern.

The constituent unit (a2') is not specifically limited as long as it has no acid dissociable dissolution inhibiting group and is alkali-insoluble, as described above, but is preferably a unit derived from (α-methyl)styrene represented by the following general formula (II'):

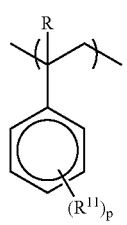

(II')

wherein R represents a hydrogen atom or a methyl group, $R^{11}$ represents an alkyl group having 1 to 5 carbon atoms and p represents an integer of 0 or 1 to 3, because of excellent dry etching resistance.

The term "(α-methyl)styrene" means either or both of styrene and α-methylstyrene. The term "constituent unit derived from (α-methyl)styrene" is apparent from the general formula (II') and means a constituent unit constituted by cleavage of ethylenical double bonds of (α-methyl)styrene.

In the formula (II'), $R^{11}$ is a linear or branched alkyl group having 1 to 5 carbon atoms and examples thereof include methyl group, ethyl group, propyl group, isopropyl group, n-butyl group, isobutyl group, tert-butyl group, pentyl group, isopentyl group and neopentyl group. Among these groups, a methyl group or an ethyl group is preferably from an industrial point of view.

p is an integer 0 or 1 to 3. Among these, p is preferably 0 or 1, and particularly preferably 0 from an industrial point of view.

When p is from 1 to 3, $R^3$ may be substituted on any of the o-, m- and p-positions. When p is 2 or 3, any substitution positions can be combined.

The content of the constituent unit (a2') in the component (A1) is preferably from 5 to 35 mol %, more preferably 10 to 30 mol %, and most preferably from 15 to 25 mol %. When the content is more than the lower limit, it is made possible to suppress a disadvantage such as reduction in film thickness of the unexposed area upon development and to improve resolution. It is also made possible to prevent swelling of a resist pattern due to alkali development and to improve resolution of a fine pattern. Control of the content to the upper limit or less easily makes the resulting composition soluble in an organic solvent.

Dissolution Rate

In this aspect, a dissolution rate of the component (A1) to an aqueous 2.38% wt % solution of TMAH (tetramethylammonium hydroxide) is from 10 to 100 nm/second, and preferably from 20 to 80 nm/second.

In the case of a small dissolution rate such as 100 nm/second or less, resolution is improved. The reason is believed to be as follows. That is, as described hereinafter, the crosslinked structure formed between the components (C1) and (A1) is dissolved in an alkali developer solution as a result of cleavage by an action of an acid at the exposed area, while the unexposed area is not dissolved in the alkali developer solution, and thus contrast at the interface can be enhanced. Also, the effect of reducing defects can be exerted.

By adjusting to 10 nm/second or more, a resist can be prepared by dissolving in an organic solvent.

The dissolution rate can be adjusted by varying the content of the constituent units (a1') and (a2'). For example, the dissolution rate can be decreased by increasing the content of the constituent unit (a2').

Specifically, the value of the dissolution rate is a value obtained in the following manner.

First, a solution prepared by dissolving the component (A1) in an organic solvent is applied on a silicon wafer and the organic solvent is vaporized by a heat treatment to form a resin coating film (thickness: 500 to 1300 nm, for example, 1000 nm). The organic solvent is appropriately selected from conventionally known organic solvents, which are described hereinafter, used in the chemical amplification type positive photoresist composition. The concentration of the component (A1) can be adjusted to the same concentration as in the resist composition, for example, 10 to 25% by weight, particularly 20% by weight. After measuring the thickness of the resin coating film, the wafer is immersed in an aqueous 2.38 wt % TMAH solution at 23° C. Then, the time required to completely dissolve the resin film is measured and reduction in film thickness per unit time (nm/second) of the resin coating film is determined therefrom.

The resulting reduction in film thickness of the resin coating film is a dissolution rate of the component (A1).

The component (A1) may comprise a constituent unit, which is copolymerizable with the constituent units (a1') and (a2'), in addition to the constituent units (a1') and (a2'). The total content of the constituent units (a1') and (a2') is preferably 80 mol % or more, and preferably 90 mol %, and most preferably 100 mol %. In view of reduction in defects, the component (A1) preferably comprises the constituent units (a1') and (a2').

The component (A1) can be mixed with one or more kinds of resins having different weight-average molecular weights and resins having different constituent units.

The component (A1) can be prepared by conventionally known radical polymerization or living anion polymerization of a monomer from which the units (a1') and (a2') are derived.

The weight-average molecular weight (Mw: value as measured by gel permeation chromatography using polystyrene standards) of the component (A1) is preferably from 1500 to 30000, more preferably 2000 to 20000, and most preferably from 3000 to 20000, in view of stability over time and reduction in defects. When the weight-average molecular weight is within the above range, it is made possible to prevent such a disadvantage that the resulting composition becomes insoluble in a solvent and dry etching resistance deteriorates.

The dispersion degree (Mw/Mn: Mn is a number-average molecular weight) of the component (A1) is preferably from 1.0 to 5.0, and more preferably 1.0 to 3.0, in view of improvement in resolution and reduction in defects.

(C1) Crosslinking Polyvinyl Ether Compound

The component (C1) serves as a crosslinking agent for the component (A1).

The crosslinking polyvinyl ether compound as the component (C1) has the following action. That is, the component (C1) functions as follows with the component (A1).

When a three-component chemical amplification type positive photoresist composition is applied on a substrate and then prebaked at a temperature within a range from 80 to 150° C., and preferably 120° C. or higher, the crosslinking reaction between the components (C1) and (A1) is caused by heating to form a resist layer, which is insoluble or slightly soluble in alkali, over the entire surface of the substrate. In the exposure step and the PEB step, crosslinking is decomposed by an action of an acid generated from the component (B1), and thus the exposed area becomes alkali soluble and the unexposed area remains alkali insoluble. Therefore, the exposed area can be removed by alkali development to form a resist pattern.

Therefore, the component (C1) is not specifically limited as long as it has such a function.

As the component (C1), for example, a compound having at least two crosslinking vinyl ether groups can be used. Specific examples thereof include ethylene glycol divinyl ether, triethylene glycol divinyl ether, 1,3-butanediol divinyl ether, tetramethylene glycol divinyl ether, neopentyl glycol divinyl ether, trimethylolpropanetrivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether and cyclohexane dimethanol divinyl ether. Among these compounds, a crosslinking divinyl ether compound is more preferable.

Also the divinyl ether compound is preferably a compound represented by the following general formula (III'):

$$H_2C=CH-O-R^{12}-O-CH=CH_2 \quad (III')$$

in the general formula (III'), $R^{12}$ is a branched or linear alkylene group having 1 to 10 carbon atoms which may have a substituent, or a substituent represented by the following general formula (IV'). The alkylene group may have an oxygen bond (ether bond) in the main chain.

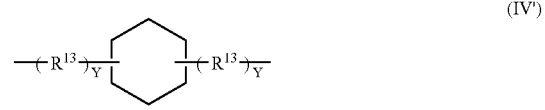

In the general formula (IV'), $R^{13}$ is also a branched or linear alkylene group having 1 to 10 carbon atoms which may have a substituent, and the alkylene group may have an oxygen bond (ether bond) in the main chain.

Y is 0 or 1.

$R^{12}$ is preferably $—C_4H_8—$, $—C_2H_4OC_2H_4—$, $—C_2H_4OC_2H_4OC_2H_4—$, or a substituent represented by the general formula (IV'). Among these, a substituent represented by the general formula (IV') is preferable. The compound is preferably a compound wherein $R^{13}$ has one carbon atom and Y is 1 (cyclohexane dimethanol divinyl ether).

As the component (C1), one or more kinds can be used in combination.

(B1) Compound Generating an Acid Under Irradiation with Radiation

In this aspect, the positive photoresist composition may further contain, as the component (B1), conventionally known photo acid generators used in a conventional chemical amplification type photoresist composition. As the photo acid generator, there have hitherto been known various photo acid generators, for example, onium salts such as iodonium salt and sulfonium salt, oxime sulfonates, bisalkyl or bisarylsulfonylazomethanes, poly(bissulfonyl)diazomethanes, diazomethanenitrobenzyl sulfonates, iminosulfonates and disulfones, and therefore, the component (B1) is not specifically limited and is selected from these conventionally known photo acid generators.

Specific examples of diazomethane photo acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Specific examples of oxime sulfonate photo acid generators include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile and α-(methylsulfonyloxyimino)-p-bromophenylacetonitrile. Among these, α-(methylsulfonyloxyimino)-p-methoxyphenylacetonitrile is preferable.

Specific examples of onium salt photo acid generators include trifluoromethane sulfonate or nonafluorobutane sulfonate of diphenyliodonium, trifluoromethane sulfonate or nonafluorobutane sulfonate of bis(4-tert-butylphenyl)iodonium, trifluoromethane sulfonate of triphenylsulfonium, heptafluoropropane sulfonate thereof or nonafluorobutane sulfonate thereof, trifluoromethane sulfonate of tri(4-methylphenyl)sulfonium, heptafluoropropane sulfonate or nonafluorobutane sulfonate thereof, trifluoromethane sulfonate of dimethyl(4-hydroxynaphthyl)sulfonium, heptafluoropropane sulfonate or nonafluorobutane sulfonate thereof, trifluoromethane sulfonate of monophenyldimethylsulfonium, heptafluoropropane sulfonate thereof or nonafluorobutane sulfonate thereof, trifluoromethane sulfonate of diphenylmonomethylsulfonium, and heptafluoropropane sulfonate or nonafluorobutane sulfonate thereof.

Examples of poly(bissulfonyl)diazomethane photo acid generators include 1,3-bis(phenylsulfonyldiazomethylsulfonyl)propane (compound A, decomposition point: 135° C.), 1,4-bis(phenylsulfonyldiazomethylsulfonyl)butane (compound B, decomposition point: 147° C.), 1,6-bis(phenylsulfonyldiazomethylsulfonyl)hexane (compound C, melting point: 132° C., decomposition point: 145° C.), 1,10-bis (phenylsulfonyldiazomethylsulfonyl)decane (compound D, decomposition point: 147° C.), 1,2-bis(cyclohexylsulfonyldiazomethylsulfonyl)ethane (compound E, decomposition point: 149° C.), 1,3-bis(cyclohexylsulfonyldiazomethylsulfonyl)propane (compound F, decomposition point: 153° C.), 1,6-bis(cyclohexylsulfonyldiazomethylsulfonyl) hexane (compound G, melting point: 109° C., decomposition point: 122° C.) and 1,10-bis(cyclohexylsulfonyldiazomethylsulfonyl)decane (compound H, decomposition point: 116° C.), each having the following structures.

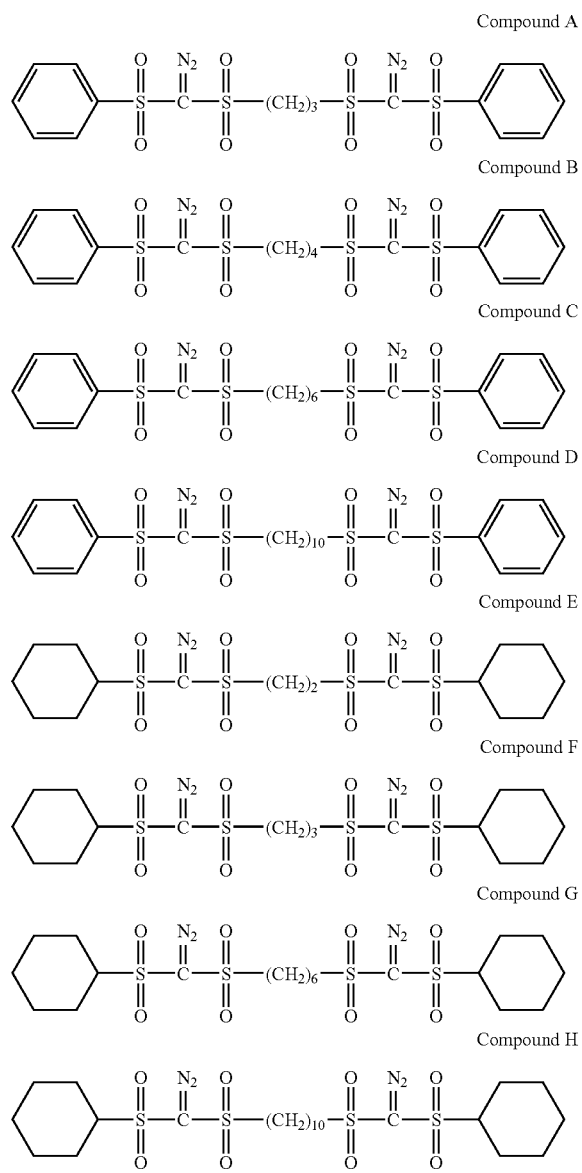

Among these photo acid generators, photo acid generators (compounds having a decomposition point of 120° C. or higher, and preferably from 120° C. to 160° C.) are preferable and poly(bissulfonyl)diazomethane photo acid generators are particularly preferable, and a compound G is most preferable.

When the photo acid generator having a decomposition point of 120° C. or higher, neither decomposition nor sublimation occurs in the case of prebaking or post exposure baking.

In the second aspect, prebaking can be conducted at low temperature up to about 80° C. and the range of selection of prebaking is widened, preferably.

Therefore, the component (B1) is not limited to poly (bissulfonyl)diazomethane photo acid generators having excellent heat resistance and the range of selection of the photo acid generator is widened, preferably. Among these, bisalkyl or bisarylsulfonylazomethanesa are preferable because of excellent resolution.

The content of the component (B1) is adjusted within a range from 0.5 to 30 parts by weight, and preferably 1 to 10 parts by weight, based on 100 parts by weight of the component (A1). When the content is less than the above range, sufficient pattern formation may not occur. On the other hand, when the content exceeds the above range, a uniform solution may not be obtained and storage stability may deteriorate.

As the component (B1), one or more kinds can be used in combination.

(D') Nitrogen-containing Organic Compound

The positive resist composition of this aspect can further contain, as an optional component, a nitrogen-containing organic compound (D') (hereinafter referred to as a component (D')) so as to improve resist pattern shape and storage stability over time.

Since various compounds have already been proposed, the component (D') may be any compound selected from conventionally known compounds and is preferably an amine, and particularly preferably a secondary lower aliphatic amine or tertiary lower aliphatic amine.

As used herein, the lower aliphatic amine refers to an amine of an alkyl or alkyl alcohol having 5 or fewer carbon atoms. Examples of the secondary and tertiary amines include trimethylamine, diethylamine, triethylamine, di-n-propylamine, tri-n-propylamine, tripentylamine, diethanolamine, and triethanolamine. Among these amines, a tertiary alkanolamine such as triethanolamine is preferable.

These amines may be used alone or in combination.

The component (D') is commonly used in an amount within a range from 0.01 to 5.0 parts by weight based on 100 parts by weight of the component (A1).

Component (E)

The positive photoresist composition of this aspect can further contain, as an optional component, an organic carboxylic acid or oxo acid of phosphorus or its derivative (E) (hereinafter referred to as a component (E)) so as to prevent deterioration of sensitivity due to the use in combination with the component (D') and to improve resist pattern shape and storage stability. The component (D') can be used in combination with the component (E) and either of them can also be used.

As the organic carboxylic acid, for example, malonic acid, citric acid, malic acid, succinic acid, benzoic acid, and salicyclic acid are preferable.

Examples of the oxo acid of phosphorus or derivatives thereof include phosphoric acid or derivatives thereof such as ester, for example, phosphoric acid, di-n-butyl phosphate or diphenyl phosphate; phosphonic acid or derivatives thereof such as ester, for example, phosphonic acid, dimethylester phosphonate or di-n-butyl phosphonate, phenyl phosphonic acid, diphenyl phosphonate, dibenzyl phosphonate; and phosphinic acid or derivatives thereof such as ester, for example, phosphinic acid, phenylphosphinic acid. Among these, phosphonic acid is particularly preferable.

The content of the component (E) is from 0.01 to 5.0 parts by weight based on 100 parts by weight of the component (A1).

Organic Solvent

The positive resist composition of this aspect can be prepared by dissolving materials in an organic solvent.

The organic solvent is not specifically limited as long as it can dissolve the respective components used to give a uniform solution, and one or more kinds can be appropriately selected from those which are conventionally known as solvents for a chemical amplification type resist.

Examples thereof include ketones such as γ-butyrolactone, acetone, methyl ethyl ketone, cyclohexanone, methyl isoamyl ketone and 2-heptanone; polyhydric alcohols and their derivatives, such as ethylene glycol, ethylene glycol monoacetate, diethylene glycol, diethylene glycol monoacetate, propylene glycol, propylene glycol monoacetate, dipropylene glycol, and monomethyl ether, monoethyl ether, monopropyl ether, monobutyl ether and monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate and ethyl ethoxypropionate.

These organic solvents may be used alone or in combination.

A solvent mixture of propylene glycol monomethyl ether acetate (PGMEA) and a polar solvent is preferable. The mixing ratio (weight ratio) may be appropriately decided taking account of compatibility of PGMEA with the polar solvent, and is preferably within a range from 1:9 to 8:2, and more preferably from 2:8 to 5:5.

More specifically, the weight ratio of PGMEA to EL is preferably from 2:8 to 5:5, and more preferably from 3:7 to 4:6, in the case of using EL as the polar solvent.

In addition, a solvent mixture of at least one selected from PGMEA and EL, and γ-butyrolactone is also preferable as the organic solvent. In this case, the mixing ratio of the former to the latter is preferably from 70:30 to 95:5 in terms of a weight ratio.

The amount of the organic solvent is not specifically limited and is appropriately adjusted so as to be applied on a substrate after preparing a coating solution having a predetermined concentration, according to the thickness of the coating film. The content of the organic solvent is commonly within a range from 2 to 20% by weight, and preferably from 5 to 15% by weight, based on the solid content of the resist composition.

Other Optional Components

If necessary, the positive resist composition of this aspect may further contain miscible additives, for example, additive resins used for improving performances of the resist film, surfactants used for improving coatability, dissolution inhibitors, plasticizers, stabilizers, colorants and antihalation agents.

Method for Formation of Resist Pattern

The resist pattern forming method of this aspect can be conducted in the following manner.

First, the above positive resist composition is applied on a substrate such as silicon wafer using a spinner and is then prebaked (PB) under the temperature conditions, for example, at 80° C. or higher, preferably 120° C. or higher and 150° C. or lower, for 40 to 120 seconds, preferably 60 to 90 seconds. After selectively exposing to KrF excimer laser beam via a desired mask pattern using a KrF stepper, PEB (post exposure bake) is conducted under temperature conditions of, for example, 80 to 150° C., for 40 to 120 seconds, and preferably 60 to 90 seconds.

In view of formation of the crosslinked structure, prebaking is preferably conducted under temperature conditions of, for example, 80° C. or higher, and preferably 90 to 110° C.

Then, development treatment is conducted using an alkali developer solution, for example, an aqueous 0.1-10 wt % TMAH solution. Thus a resist pattern, which is faithful to the mask pattern, can be obtained.

Between the substrate and the coating layer made of the resist composition, an organic or inorganic antireflective coat can also be provided.

The wavelength of light used for exposure is not specifically limited and the exposure can be conducted using radiation such as ArF excimer laser, KrF excimer laser, $F_2$ excimer laser, EUV (extreme ultraviolet light), VUV (vacuum ultraviolet light), EB (electron beam), X-rays and soft X-rays. A KrF excimer laser is particularly effective for the chemical amplification type positive photoresist composition of this aspect.

In the chemical amplification type positive photoresist composition and the method for formation of a resist pattern according to the second aspect of the present invention, excellent resolution can be obtained. When using a short-wavelength light source such as a KrF excimer laser, required fine patterns can be resolved. More specifically, in the case of L&S (line-and-space) pattern, it is made possible to resolve a pattern having a width of about 300 nm or less, preferably. Furthermore, reduction in defects can be realized. Therefore, failure of fine patterns can be avoided and it is very advantageous for high integration.

In this example, the reason why excellent resolution is obtained is not certain, but one factor is believed to be as follows. That is, since the component (A1) has a small dissolution rate, a difference in solubility between the unexposed area and the exposed area increases.

One factor for reduction in defects is believed to be as follows. That is, since it is not necessary to protect the component (A1) with an acid dissociable dissolution inhibiting group, it is less likely to cause such a failure that the substance involved in defects dissolved in an alkali developer solution is deposited when rinsed with pure water after developing with an alkali developer solution.

Also line edge roughness (LER: unevenness of line side wall) can be suppressed. It is believed that reduction in LER is caused by the same factors as in the case of defects.

In the formation of the resist pattern, since the unexposed area is composed of a coating film containing a base resin having comparatively high molecular weight wherein a crosslinked structure is formed of the component (C1), there is also exerted the effect that the resist pattern has excellent heat resistance.

Also the acid component generated from the component (B1) exerts the effect capable of raising the limit for PEB conditions because conversion of slight alkali solubility or alkali insolubility into alkali solubility due to the acid component requires a relatively small amount of energy.

EXAMPLES

Example of First Aspect

In this example, various physical properties of a photoresist composition were determined in the following manner. A basic operation of forming a resist pattern is as follows.

Using a spinner, the photoresist composition was applied on a silicon wafer and then dried on a hot plate at 130° C. for 90 seconds to form a resist film having a thickness of 3 μm. This film was selectively exposed via a mask using a Step-and-Repeat System NSR-2005i10D (manufactured by Nikon Corporation, NA (Numerical Aperture)=0.57 (variable)), subjected to a PEB (post exposure bake) treatment at 110° C. for 90 seconds, developed with an aqueous 2.38 wt % TMAH solution at 23° C. for 60 seconds, washed with water for 30 seconds, and then dried.

(1) Eop Sensitivity

The exposure time required to form a pattern composed of line-and-space width (L&S) (1:1) each having a width of 1.5 μm by selective exposure at intervals within a range from 0.1 to 0.01 seconds is represented as Eop sensitivity in units of milliseconds (ms).

Eop sensitivity of 400 ms is suited as a thick film used for formation of implantation or metal wiring.

(2) Resolution

Resolution was represented by threshold resolution at the Eop sensitivity (Eop exposure amount).

(3-1) Profile (Evaluation of Pattern Dependence: Fine Pattern):

A profile of a resist pattern composed of L&S (1:1) each having a width of 1.5 μm was observed by SEM (scanning electron microscope) micrograph. The case in which a rectangular profile was obtained was rated "A", the case in which a generally rectangular profile was observed, however, T-top shape, undercutting shape at the substrate interface or tailing shape was observed was rated "B", and the case where separated pattern could not be obtained was rated "C".

(3-2) Profile (Evaluation of Pattern Dependence: Rough Pattern):

A profile of a resist pattern composed of L&S (1:1) each having a width of 5.0 μm was observed in a SEM (scanning electron microscope) micrograph. The case where a rectangular profile was obtained was rated "A", the case where generally rectangular profile was observed, however, T-top shape, undercutting shape at the substrate interface or tailing shape was observed was rated "B", and the case where separated pattern could not be obtained was rated "C".

(4) Evaluation of Storage Stability as Resist Solution in Bottle

The resist composition was prepared and, after sampling in a bottle, it was stored at room temperature (25° C.) and exposure amount dimensional curve was measured. As a result, the case where no dimensional change was observed after 3 months was rated "A", and the case where dimensional change was observed after 2 weeks was rated "B".

The exposure amount dimensional curve was determined as follows. That is, the resist composition was periodically sampled during storage and selective exposure at the resist sensitivity (above Eop sensitivity) before storage was conducted. The dimensional width (line width) of the resulting 1.5 μm L&S was measured by critical dimension measurement SEM and the resulting values were plotted.

(5) Evaluation of Heat Resistance

After development, postbaking was conducted under conditions at 110° C., 120° C., 130° C., 140° C., 150° C. and 160° C. for 300 seconds and a profile of a 5.0 μm pattern was observed by a SEM (scanning electron microscope).

As a result, maximum temperature at which a pattern shape did not substantially change is shown in the table.

When the resulting pattern has good rectangular shape even at 150° C., it is suited as a thick film used for implantation or metal wiring.

In this example, a thick-film process such as implantation and metal wiring was not actually conducted. However, it can be judged whether or not it is suited for such applications by evaluation of sensitivity and heat resistance.

Synthesis Example 1

Synthesis of Novolak Resin 1

Using a phenol mixture of m-cresol/p-cresol in a molar ratio of 40/60 and an aldehyde mixture of formaldehyde/salicylaldehyde in a molar ratio of 1/0.3, the condensation polymerization reaction was conducted by a conventional method to obtain a novolak resin. The resulting novolak resin has Mw of 5449 and a dispersion degree (Mw/Mn) of 10.4 (Mn: weight-average molecular weight).

The concentration 10 ppm of the acid component in the novolak resin was reduced to 10 ppm or less by the following treatment. After the treatment, the concentration of the acid component was lower than 0.1 ppm as a detection limit.

100 g of the novolak resin was dissolved in MIBK (methyl isobutyl ketone) to obtain a solution having a solid content of 30% by weight and the same amount as that of the solution of pure water was added to the solution, followed by stirring for 15 minutes. After the completion of stirring, the reaction solution was allowed to stand and the separated pure water layer was removed. Using pure water, the same operation was repeated six times. Then, the solution was concentrated under reduced pressure until the water content in the solution was reduced to 0.1% by weight to obtain a novolak resin solution wherein the acid component is removed.

Synthesis Example 2

Synthesis of Novolak Resin 2

Using m-cresol and formaldehyde, the condensation polymerization reaction was conducted by a conventional method to obtain a novolak resin. The resulting novolak resin had a Mw of 8137 and a dispersion degree (Mw/Mn) of 11.5.

Then, the concentration 10 ppm of the acid component in the novolak resin was reduced to 10 ppm or less by the same treatment as in Synthesis Example 1. After the treatment, the concentration of the acid component was lower than 0.1 ppm which is a detection limit.

Synthesis Example 3

Synthesis of Novolak Resin 3

Using m-cresol and an aldehyde mixture of formaldehyde/salicylaldehyde in a molar ratio of 1/0.3, the condensation polymerization reaction was conducted by a conventional method to obtain a novolak resin. The resulting novolak resin had a Mw of 5718 and a dispersion degree (Mw/Mn) of 8.0.

Then, the concentration 10 ppm of the acid component in the novolak resin was reduced to 10 ppm or less by the same treatment as in Synthesis Example 1. After the treatment, the concentration of the acid component was lower than 0.1 ppm which is a detection limit.

Synthesis Example 4

Synthesis of Preresin 1

While stirring, the novolak resin 1 was dissolved in a methyl isobutyl ketone (MIBK) solvent at a concentration of 30% by weight and, after controlling the inner temperature within a range from 100 to 110° C., a crosslinking agent (cyclohexane dimethanol divinyl ether) was added dropwise in the amount of 8 parts by weight based on 100 parts by weight of the solid content of the resin.

During the dropwise addition, the concentration of the crosslinking agent was controlled to 30% by weight (in a MIBK solution). After reacting for 24 hours, post-stirring was conducted at room temperature for 12 hours or more, the solvent MIBK was replaced by 2-heptanone.

The resulting component (A) (preresin 1) had a weight-average molecular weight of 25000.

The concentration of the acid component in the component (A) was 2.5 ppm.

Synthesis Example 5

Synthesis of Preresin 2

In the same manner as in Synthesis Example 4, except that the novolak resin 2 was used, a preresin 2 was obtained. The weight-average molecular weight was 38000 and the concentration of the acid component was 2.2 ppm.

Synthesis Example 6

Synthesis of Preresin 3

In the same manner as in Synthesis Example 4, except that novolak resin 3 was used, a preresin 3 was obtained. The weight-average molecular weight was 23000 and the concentration of the acid component was 1.8 ppm.

Synthesis Example 7

Synthesis of Preresin 4

A styrenic resin 1 (hydroxystyrene-styrene copolymer (content of styrene constituent unit: 10 mol %, weight-average molecular weight: 2500)) was purified by ion exchange and, after replacing by γ-butyrolactone, the concentration was adjusted to 30% by weight. Then, acetic acid was added in a proportion of 0.1% based on the solid content of the resin and a crosslinking agent (cyclohexane dimethanol divinyl ether) was added dropwise in an amount of 9.5 parts by weight based on 100 parts by weight of the solid content of the resin while stirring at an inner temperature within a range from 100 to 110° C.

During the dropwise addition, the concentration of the crosslinking agent was adjusted to 30% by weight (in a γ-butyrolactone solution). After reacting for 21 hours, 4 g of pyridine was added dropwise. After stirring for one hour at room temperature, the solution was dissolved in 2-heptanone. The resulting solution was washed five times with methanol/pure water, and then the 2-heptanone layer was separated and concentrated to remove the residual methanol/water.

The resulting component (A') and a weight-average molecular weight of 85563. The concentration of the acid component was 0.51 ppm.

Synthesis Example 8

Synthesis of Preresin 5

In the same manner as in Synthesis Example 7, except that a styrenic resin 2 (hydroxystyrene-styrene copolymer (content of styrene constituent unit: 5 mol %, weight-average molecular weight: 4000)) was used, a component (A') (weight-average molecular weight: 96500, concentration of acid component: 0.8 ppm) was prepared.

Synthesis Example 9

Synthesis of Preresin 6

In the same manner as in Synthesis Example 7, except that a styrenic resin 3 (hydroxystyrene-styrene copolymer (content of styrene constituent unit: 20 mol %, weight-average molecular weight: 2000)) was used, a component (A') (weight-average molecular weight: 65000, concentration of acid component: 1.5 ppm) was prepared.

Synthesis Example 10

Synthesis of Preresin 7

In the same manner as in Synthesis Example 7, except that a styrenic resin 4 (polyhydroxystyrene (weight-average molecular weight: 4000)) was used, a component (A') (weight-average molecular weight: 87000, concentration of acid component: 2.5 ppm) was prepared.

Example 1

Component (A) (preresin 1): 100 parts by weight (calculated based on the solid content)

Component (B) (compound represented by the general formula (vii)): 2 parts by weight Component (C) (t-n-decylamine): 0.2 parts by weight Other components (2,6-di(tert-butyl)-p-cresol): 0.5 parts by weight The above components were dissolved in 2-heptanone in a concentration of 35% by weight and then filtered through a membrane filter having a pore diameter of 0.2 μm to prepare a resist composition. Physical properties (1) to (5) and the concentration of the acid component (acid component measured: oxalic acid, propionic acid, formic acid and acetic acid, the same rule applies to the following) of the resist composition are shown in Table 1.

Examples 2 to 7

In the same manner as in Example 1, except that the component (A) was replaced by the preresins 2 to 7 (each corresponding to Examples 2 to 7) synthesized in the above Synthesis Examples in Example 1, resist compositions were prepared.

Physical properties (1) to (5) and the concentration of the acid component of these resist compositions are shown in Table 1.

Comparative Example 1

In the same manner as in Example 1, except that acetic acid was added to the resist composition used in Example 1 and the concentration of the acid component of the resist composition was adjusted to 24.9 ppm in Example 1, a resist composition was prepared.

Physical properties (1) to (5) and the concentration of the acid component of this resist composition are shown in Table 1.

Comparative Examples 3 to 8

In the same manner as in Examples 2 to 7, except that acetic acid was added to the resist composition used in Examples 2 to 7 and the concentration of the acid component of the resist composition was adjusted to the concentration shown in Table 1, resist compositions were prepared.

Physical properties (1) to (5) and the concentration of the acid component of the resist compositions are shown in Table 1.

Comparative Example 9

In the same manner as in Example 1, except that a novolak-naphthoquinone positive photoresist composition for i-ray "THMR-iP5800" (trade name: manufactured by Tokyo Ohka Kogyo Co., Ltd.) was used in place of the composition of Example 1, a resist compositions was prepared. Physical properties (1) to (5) of the resist composition are shown in Table 1.

TABLE 1

| | (1) Eop sensitivity (ms) | (2) Resolution (μm) | (3-1) Profile (fine pattern) | (3-2) Profile (rough pattern) | (4) Storage stability as a resist solution in a bottle | (5) Heat resistance (° C.) | Concentration of Acid component (ppm) |
|---|---|---|---|---|---|---|---|
| Example 1 | 320 | 0.7 | A | A | A | 160 | 0.4 |
| Example 2 | 380 | 0.7 | B | B | A | 120 | 0.3 |
| Example 3 | 260 | 0.7 | B | A | A | 140 | 0.3 |
| Example 4 | 140 | 0.8 | A | A | A | 150 | 0.3 |
| Example 5 | 200 | 0.8 | B | B | A | 150 | 0.1 |
| Example 6 | 180 | 0.8 | B | B | A | 140 | 0.4 |
| Example 7 | 180 | 0.8 | B | B | A | 140 | 0.8 |
| Comparative Example 1 | 320 | 0.7 | A | A | B | 160 | 24.9 |
| Comparative Example 2 | 420 | 0.6 | B | B | B | 160 | 4.2 |
| Comparative Example 3 | 380 | 0.7 | B | B | B | 120 | 35.2 |
| Comparative Example 4 | 260 | 0.7 | B | A | B | 140 | 49.5 |
| Comparative Example 5 | 140 | 0.6 | A | A | B | 150 | 19.8 |
| Comparative Example 6 | 200 | 0.8 | B | B | B | 150 | 33.7 |
| Comparative Example 7 | 180 | 0.8 | B | B | B | 140 | 13.9 |
| Comparative Example 8 | 180 | 0.8 | B | B | B | 140 | 21.2 |
| Comparative Example 9 | 450 | 0.7 | C | B | A | 120 | not measured |

Comparative Example 2

Component (A) (novolak resin 1): 100 parts by weight (calculated based on the solid content)
Component (B) (compound represented by the general formula (vii)): 2 parts by weight
Component (C) (t-n-decylamine): 0.2 parts by weight
Other components (cyclohexane dimethanol divinyl ether): 8 parts by weight The above components were dissolved in 2-heptanone in the concentration of 35% by weight and then filtered through a membrane filter having a pore diameter of 0.2 μm to prepare a resist composition.

Physical properties (1) to (5) and the concentration of the acid component of the resist composition are shown in Table 1.

As is apparent from the results shown in Table 1, the resist composition of this aspect was excellent in sensitivity, resolution, and storage stability as a resist solution in a bottle, and also exhibited good profile in both cases of a rough pattern and a fine pattern and was excellent in heat resistance.

Examples of Second Aspect

Synthesis Examples

A resin 1 and a resin 2 were synthesized in the following manner.

Synthesis of Resin 1

In the same manner as in Synthesis Example 7, except that a copolymer (weight-average molecular weight: 3000; corresponding to the component (A1)) obtained by polymerizing 70 mol % of a monomer (p-hydroxystyrene) capable of deriving a constituent unit (a1') of the general formula (I') wherein R=hydrogen atom, 1=1 and hydroxyl group is linked at the p-position with 30 mol % of a monomer (styrene) capable of deriving a constituent unit (a2') of the general formula (II') wherein R=hydrogen atom and p=0 was used in place of the styrenic resin 1 in Synthesis Example 7, a resin 1 was synthesized. The weight-average molecular weight was 45000.

Synthesis of Resin 2

In the same manner as in the case of the synthesis of the resin 1, except that a copolymer (weight-average molecular weight: 2500) comprising the monomer (p-hydroxystyrene) capable of deriving the constituent unit (a1') and the monomer (styrene) capable of deriving the constituent unit (a2') in a ratio of 90 mol %:10 mol % was used in place of the copolymer synthesized in the Synthesis Example in the synthesis of the resin 1, a resin 2 was obtained. The weight-average molecular weight was 86000.

Example 8

The following materials were dissolved in the following organic solvent to prepare a chemical amplification type positive photoresist composition.
Component (A2) (resin mixture of resin 1/resin 2 in a weight ratio of 1:1): 100 parts by weight
Component (B2) (compound represented by the following chemical formula): 5 parts by weight

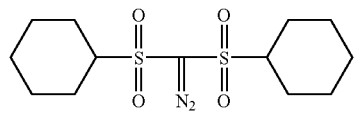

Component (D') (triethanolamine): 0.15 parts by weight
Organic solvent (PGMEA/EL=6/4(weight ratio)): 630 parts by weight Comparative Example 10

Resin component: 100 parts by weight
(Mixture of 75 parts by weight of a resin obtained by protecting 39 mol % of hydroxyl groups of a hydroxystyrenic resin (homopolymer of p-hydroxystyrene, weight-average molecular weight: 12000, dispersion degree=2.2) comprising only a constituent unit (a1') of the general formula (I') wherein R=hydrogen atom, 1=1 and hydroxyl group is linked at the p-position, with a 1-ethoxyethyl group, and 25 parts by weight of a resin obtained by protecting 35 mol % of hydroxyl groups of a hydroxystyrenic resin (homopolymer of p-hydroxystyrene, weight-average molecular weight: 12000, dispersion degree=2.2) comprising only a constituent unit (a1') of the general formula (I') wherein R=hydrogen atom, 1=1 and a hydroxyl group is linked at the p-position, with a t-boc group, dissolution rate: 0.5 nm/second
Component (B1) (bis(cyclohexylsulfonyl)diazomethane): 5.0 parts by weight
Component (D') (triethanolamine) 0.1 parts by weight
Organic solvent (PGMEA): 600 parts by weight Comparative Example 11

Component (A1): hydroxystyrenic resin (resin comprising only a constituent unit (a1') of the general formula (I') wherein R=hydrogen atom, 1=1 and a hydroxyl group is linked at the p-position) (homopolymer of p-hydroxystyrene, weight-average molecular weight: 12000, dispersion degree: 2.2): 100 parts by weight
Dissolution rate: 500 nm/second or more
Component (B1): the same as in Comparative Example 10
Component (C1): cyclohexane dimethanol divinyl ether 20 parts by weight
Component (D'): the same as in Comparative Example 10
Organic solvent PGMEA/EL=6/4(weight ratio): 630 parts by weight Evaluation Method With respect to the chemical amplification type positive photoresist compositions obtained in Example 8 and Comparative Examples 10 and 11, the following evaluations (1) to (2) were conducted.

(1) Evaluation of Resolution

Each resist composition was applied on an 8-inch Si substrate whose surface was treated with hexamethyldisilazane (HMDS) using a spinner and was then dried on a hot plate by prebaking under the conditions at 130° C. for 60 seconds (Example 8), at 100° C. for 60 seconds (Comparative Example 10) or at 130° C. for 60 seconds (Comparative Example 11) to obtain a resist film having a thickness of 540 nm (Example 8) and resist films having a thickness of 420 nm (Comparative Examples 10 and 11).

Using a KrF aligner (trade name: "NSR-S203B", manufactured by Nikon Corporation, NA=0.60, σ=0.65), the resist film was selectively irradiated (selective exposure) with KrF excimer laser (248 nm) via a mask (binary), subjected to a PEB treatment under conditions at 110° C. for 60 seconds (Example 8), at 110° C. for 60 seconds (Comparative Example 10) or at 130° C. for 60 seconds (Comparative Example 11), puddle-developed with an aqueous 2.38 wt % tetramethylammonium hydroxide solution at 23° C. for 60 seconds and then rinsed with pure water for 10 seconds. After subjecting to shake-off drying and drying, a L&S (line-and-space) pattern was formed.

Then, the exposure amount ($EOP_{300}$, unit: $mJ/cm^2$) at which a L&S resist pattern having a line width 300 nm and a pitch of 600 nm can be faithfully reproduced was determined.

Selective exposure was conducted at the above $EOP_{300}$ and the formed pattern was observed by a scanning electron microscope.

As a result, a L&S pattern of 180 nm (pitch: 360 nm) could be resolved in Example 8, while only a L&S pattern of 220 nm (pitch: 440 nm) could be resolved in Comparative Example 10. The entire resist film was dissolved during the development in Comparative Example 11.

With respect to the Examples, the same test was conducted by varying the temperature of prebaking and PEB. As a result, a L&S pattern of 180 nm (pitch: 360 nm) could be resolved at the prebake temperature/PEB temperature of 120° C./110° C., 130° C./100° C. and 130° C./110° C.

(2) Evaluation of Defects

With respect to the resist pattern formed in the above evaluation (1), defects were measured by a surface defect detection equipment KLA2132 (trade name) manufactured by KLA-TENCOR CORPORATION and then the number of defects on the wafer was evaluated.

As a result, the number of defects per wafer was 5 in Example 8, and 260 in Comparative Example 10. In Comparative Example 11, evaluation could not be conducted because the entire resist film was dissolved.

It could be confirmed from the evaluation results of the above Examples and Comparative Examples that the chemical amplification type positive photoresist composition of this aspect exerts the effect of improving resolution and reducing defects.

INDUSTRIAL APPLICABILITY

The chemical amplification type positive photoresist composition and the resist pattern forming method of the present invention are suited for use in the fields of the production of semiconductors and liquid crystal devices.

What is claimed is:

1. A chemical amplification type positive photoresist composition comprising (A2) a resin made of a reaction product of (A1) an alkali soluble resin and (C1) a crosslinking polyvinyl ether compound wherein alkali solubility enhances by an action of an acid, and (B1) a photo acid generator generating acid under irradiation with radiation, wherein the component (A1) comprises a unit (a1') derived from (α-methyl)hydroxystyrene represented by the following general formula (I'):

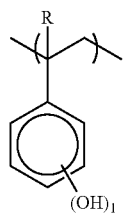

(I')

wherein R represents a hydrogen atom or a methyl group and l represents an integer of 1 to 3, and an alkali-insoluble unit (a2') having no acid dissociable dissolution inhibiting group, and wherein a dissolution rate of the component (A1) to an aqueous 2.38% by weight solution of TMAH (tetramethylammonium hydroxide) is from 10 to 100 nm/second, wherein the component (B1) is a poly(bissulfonyl)diazomethane photo acid generator.

2. The chemical amplification type positive photoresist composition according to claim 1, wherein the constituent unit (a2') is a unit derived from (α-methyl)styrene represented by the following general formula (II'):

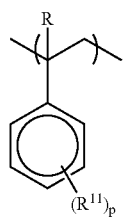

(II')

wherein R represents a hydrogen atom or a methyl group, R[11] represents an alkyl group having 1 to 5 carbon atoms and p represents an integer of 0 or 1 to 3.

3. The chemical amplification type positive photoresist composition according to claim 2, wherein the content of constituent unit (a2') in the component (A1) is from 5 to 35 mol %.

4. The chemical amplification type positive photoresist composition according to claim 1, wherein the weight-average molecular weight of the component (A2) is from 20000 to 150000.

5. The chemical amplification type positive photoresist composition according to claim 1, which further comprises a nitrogen-containing organic compound (D').

6. A resist pattern forming method, which comprises applying the chemical amplification type positive photoresist composition of claim 1 on a substrate, and subjecting to prebaking, selective exposure, PEB (post exposure bake) and alkali development to form a resist pattern.

7. A method for formation of a resist pattern of a thick-film photolithography process, which comprises forming a resist film having a thickness of 2 to 7 μm made of a chemical amplification type positive resist composition on a substrate, wherein said chemical amplification type positive photoresist composition is prepared by dissolving:

(A') a slightly alkali-soluble or alkali-insoluble polyhydroxystyrenic resin having a property that solubility in an aqueous alkali solution is enhanced in the presence of an acid, comprising either or both or a constituent unit (a'1) represented by the following general formula (IV):

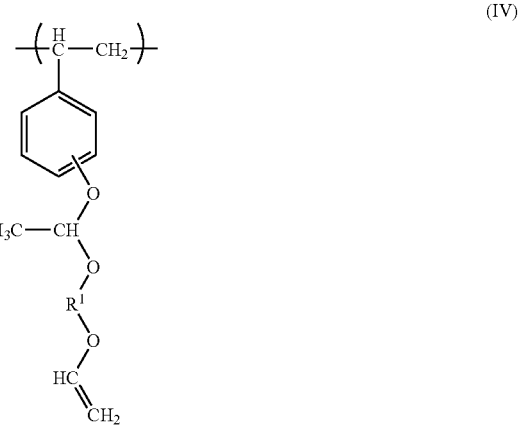

(IV)

wherein $R^1$ represents either an alkylene group having 1 to 10 carbon atoms which may have a substituent or a group represented by the following general formula (II):

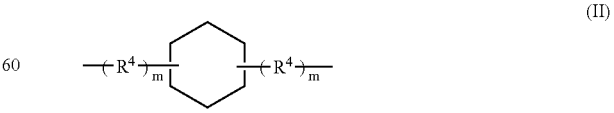

(II)

(wherein $R^4$ represents an alkylene group having 1 to 10 carbon atoms which may have a substituent and m represents 0 or 1), the alkylene group may have a oxygen bond (ether bond) in the main chain, and an intermolecular crosslinked moiety (a'2) represented by the following general formula (V):

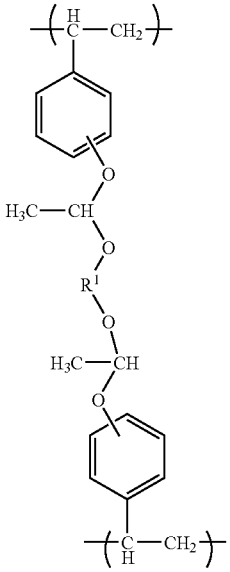
(V)

wherein $R^1$ represents either an alkylene group having 1 to 10 carbon atoms which may have a substituent or a group represented by the following general formula (II):

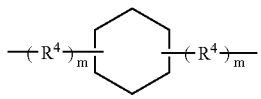
(II)

(wherein $R^4$ represents an alkylene group having 1 to 10 carbon atoms which may have a substituent and m represents 0 or 1), the alkylene group may have an oxygen bond (ether bond) in the main chain; and (B) a poly(bissulfonyl)diazomethane photoacid generator in an organic solvent, wherein the content of an acid component in the entire photoresist composition is 10 ppm or less;

and subjecting to selective exposure, post exposure bake (PEB) treatment, and development.

8. The method for formation of a resist pattern according to claim 7, wherein a resist pattern for implantation is formed in the thick-film photolithography process.

9. A method for formation of a resist pattern of a thick-film photolithography process, which comprises forming a resist film having a thickness of 2 to 7 μm made of a chemical amplification type positive resist composition on a substrate, wherein said chemical amplification type positive photoresist composition is prepared by dissolving:

(A'') a slightly alkali-soluble or alkali-insoluble polyhydroxystyrenic resin having such a property that solubility in an aqueous alkali solution is enhanced in the presence of an acid comprising either or both of a constituent unit (a'1) represented by the following general formula (IV):

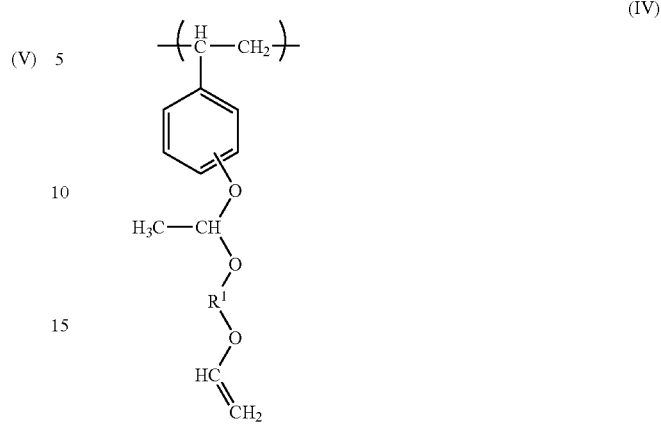
(IV)

wherein $R^1$ represents either an alkylene group having 1 to 10 carbon atoms which may have a substituent or a group represented by the following general formula (II):

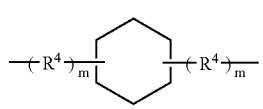
(II)

(wherein $R^4$ represents an alkylene group having 1 to 10 carbon atoms which may have a substituent and m represents 0 or 1), the alkylene group may have an oxygen bond (ether bond) in the main chain, and an intermolecular crosslinked moiety (a'2) represented by the following general formula (V):

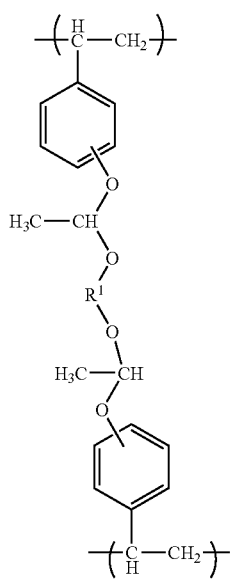
(V)

wherein $R^1$ represents either an alkylene group having 1 to 10 carbon atoms which may have a substituent or a group represented by the following general formula (II):

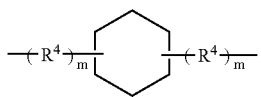 (II)

(wherein R⁴ represents an alkylene group having 1 to 10 carbon atoms which may have a substituent and m represents 0 or 1), the alkylene group may have an oxygen bond (ether bond) in the main chain, and a styrenic constituent unit; and (B) a poly(bissulfonyl)diazomethane photoacid generator in an organic solvent, wherein the content of an acid component in the entire photoresist composition is 10 ppm or less;

and subjecting to selective exposure, post exposure bake (PEB) treatment, and development.

10. The method for formation of a resist pattern according to claim 9, wherein a resist pattern for implantation is formed in the thick-film photolithography process.

* * * * *